(12) United States Patent
Ku et al.

(10) Patent No.: US 12,288,735 B2
(45) Date of Patent: Apr. 29, 2025

(54) THROUGH VIA STRUCTURE

(71) Applicant: Taiwan Semiconductor Manufacturing Company, Ltd., Hsin-Chu (TW)

(72) Inventors: Min-Feng Ku, Hsinchu (TW); Yao-Chun Chuang, Hsinchu (TW); Cheng-Chien Li, Hsinchu County (TW); Ching-Pin Lin, Hsinchu County (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 449 days.

(21) Appl. No.: 17/833,481

(22) Filed: Jun. 6, 2022

(65) Prior Publication Data
US 2023/0187315 A1 Jun. 15, 2023

Related U.S. Application Data

(60) Provisional application No. 63/289,698, filed on Dec. 15, 2021.

(51) Int. Cl.
| | |
|---|---|
| *H01L 23/48* | (2006.01) |
| *H01L 21/768* | (2006.01) |
| *H01L 23/522* | (2006.01) |
| *H01L 23/528* | (2006.01) |
| *H01L 23/538* | (2006.01) |
| *H01L 23/58* | (2006.01) |

(52) U.S. Cl.
CPC ...... *H01L 23/481* (2013.01); *H01L 21/76816* (2013.01); *H01L 21/76877* (2013.01); *H01L 21/76898* (2013.01); *H01L 23/5226* (2013.01); *H01L 23/528* (2013.01); *H01L 23/5389* (2013.01); *H01L 23/585* (2013.01)

(58) Field of Classification Search
CPC ............. H01L 23/481; H01L 21/76816; H01L 21/76877; H01L 21/76898; H01L 23/5226
USPC ........................................................ 257/774
See application file for complete search history.

(56) References Cited

U.S. PATENT DOCUMENTS

| | | | |
|---|---|---|---|
| 2011/0193199 A1* | 8/2011 | Filippi ................ | H01L 25/0657 438/106 |
| 2013/0154048 A1* | 6/2013 | Lu ......................... | H01L 23/481 438/667 |
| 2022/0359483 A1* | 11/2022 | Hung ....................... | H01L 25/50 |

FOREIGN PATENT DOCUMENTS

DE         102021100457 A1    7/2022

* cited by examiner

*Primary Examiner* — Xia L Cross
(74) *Attorney, Agent, or Firm* — HAYNES AND BOONE, LLP

(57) ABSTRACT

An exemplary semiconductor structure includes a device substrate having a first side and a second side. A dielectric layer is disposed over the first side of the device substrate. A through via extends along a first direction through the dielectric layer and through the device substrate from the first side to the second side. The through via has a total length along the first direction and a width along a second direction that is different than the first direction. The total length is a sum of a first length of the through via in the dielectric layer and a second length of the through via in the device substrate. The first length is less than the second length. A guard ring is disposed in the dielectric layer and around the through via.

20 Claims, 17 Drawing Sheets

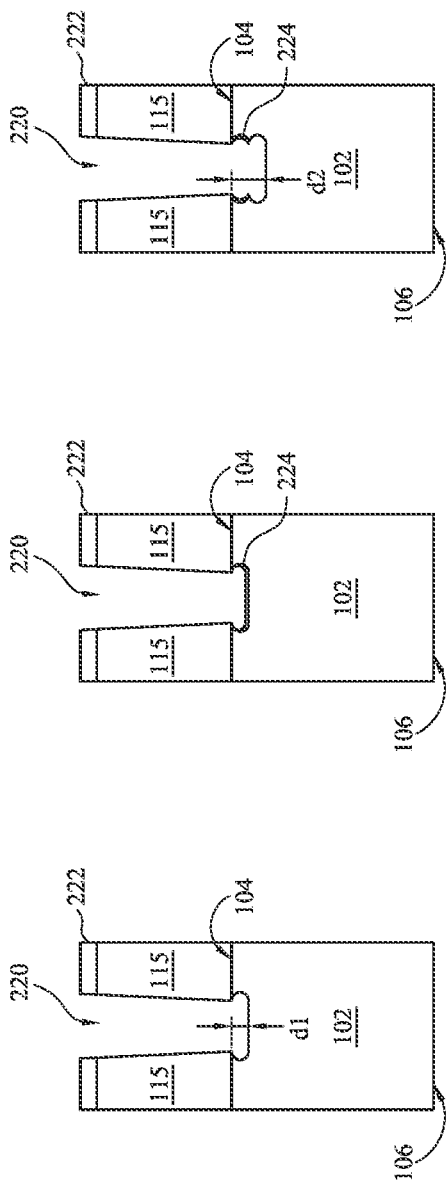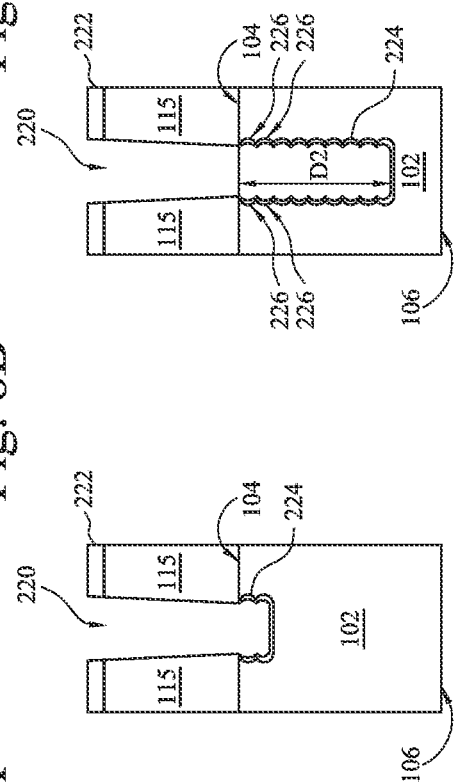

THROUGH VIA STRUCTURE

This is a non-provisional application of and claims benefit of U.S. Provisional Patent Application Ser. No. 63/289,698, filed Dec. 15, 2021, the entire disclosure of which is incorporated herein by reference.

BACKGROUND

The semiconductor integrated circuit (IC) industry has experienced rapid growth. Continuing advances in semiconductor manufacturing processes have resulted in integrated circuits ("ICs") having semiconductor devices with finer features and/or higher degrees of integration. Functional density (i.e., the number of interconnected devices per IC chip area) has generally increased while feature size (i.e., the smallest component that can be created using a fabrication process) has decreased. This scaling-down process generally has generally provided benefits by increasing production efficiency and lowering associated costs.

Advanced IC packaging technologies have been developed to further reduce density and/or improve performance of ICs, which are incorporated into many electronic devices. For example, IC packaging has evolved, such that multiple ICs may be vertically stacked in so-called three-dimensional ("3D") packages, or 2.5D packages (which use an interposer). Through via (also referred to as through-silicon via (TSV)) is one technique for electrically and/or physically connecting stacked ICs. Although existing through vias have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with standard practice in the industry, various features are not drawn to scale and are used for illustration purposes only. Dimensions of the various features may be arbitrarily increased or reduced for clarity of discussion.

FIGS. 8A-8E are fragmentary cross-sectional views of a workpiece, in portion or entirety, at various fabrication stages of forming a TSV trench, which can be implemented at the fabrication stage of FIG. 7E, according to various aspects of the present disclosure.

DETAILED DESCRIPTION

Figure 1:
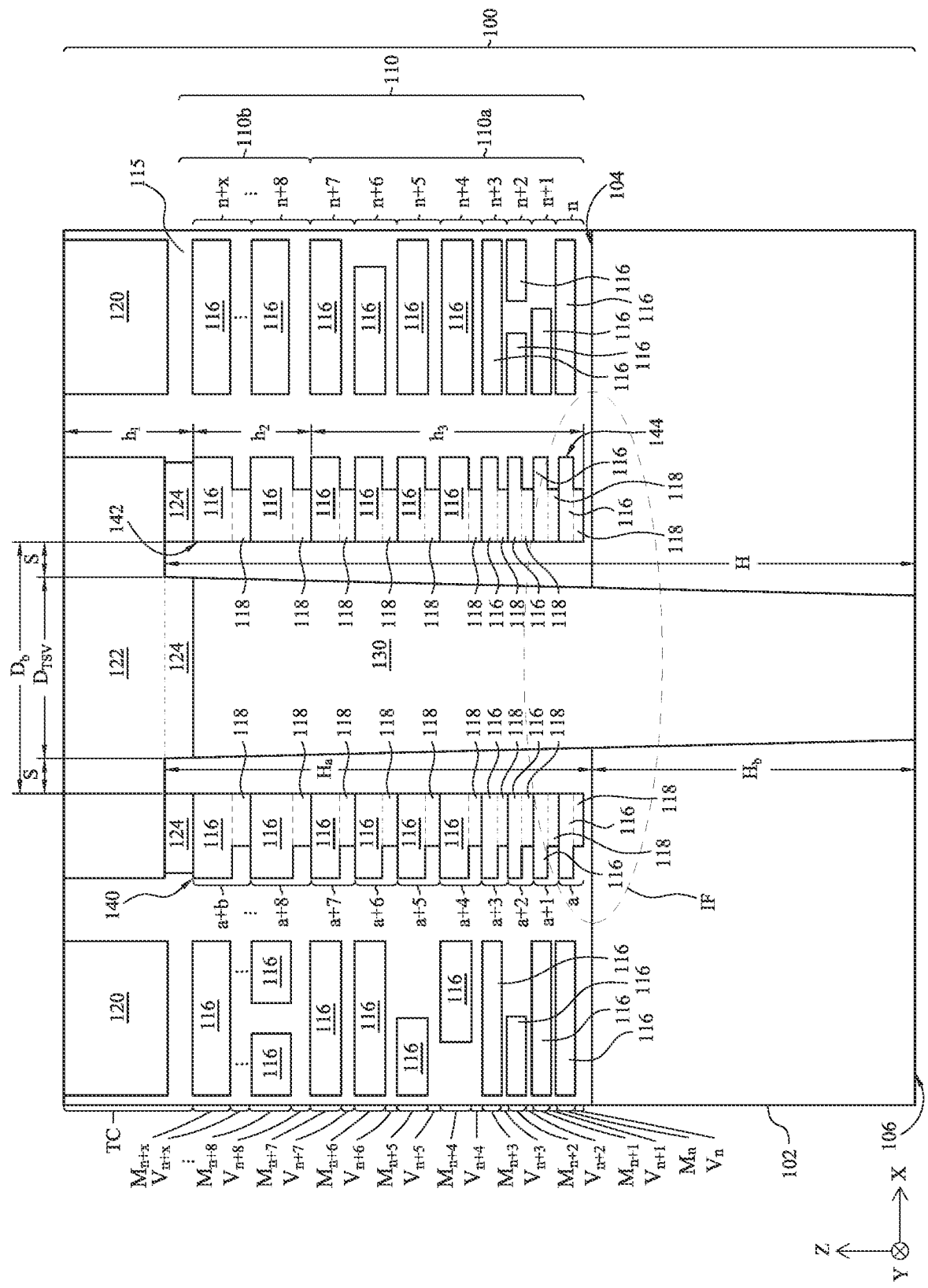
FIG. 1 is a fragmentary cross-sectional view of a semiconductor structure having an improved through substrate via (TSV) (i.e., vertical conductive interconnect structure) design, in portion or entirety, according to various aspects of the present disclosure.

The present disclosure relates generally to integrated circuit (IC) packaging, and more particularly, to enhanced through via structures for IC packaging.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first feature and the second feature are formed in direct contact and may also include embodiments in which additional features may be formed between the first feature and the second feature, such that the first feature and the second feature may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Furthermore, when a number or a range of numbers is described with "about," "approximate," "substantially," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. In another example, two features described as having "substantially the same" dimension and/or "substantially" oriented in a particular direction and/or configuration (e.g., "substantially parallel") encompasses dimension differences between the two features and/or slight orientation variances of the two features from the exact specified orientation that may arise inherently, but not intentionally, from manufacturing tolerances associated with fabricating the two features. Still further, the present disclosure may repeat reference numerals and/or letters in the various examples. This repetition is for the purpose of simplicity and clarity and does not in itself dictate a relationship between the various embodiments and/or configurations described herein.

Advanced IC packaging technologies have been developed to further reduce density and/or improve performance of integrated circuits (ICs), which are incorporated into many electronic devices. For example, IC packaging has evolved, such that multiple ICs may be vertically stacked in three-dimensional ("3D") packages or 2.5D packages (e.g., packages that implement an interposer). Through via (also referred to as through-silicon via (TSV)) is one technique for electrically and/or physically connecting stacked ICs. For example, where a first chip is stacked vertically over a second chip, a TSV may be formed that extends vertically through the first chip to the second chip. The TSV electrically and/or physically connects a first conductive structure (e.g., first wiring) of the first chip to a second conductive structure (e.g., second wiring) of the second chip. The TSV is a conductive structure, such as a copper structure, and may extend through an entirety of the first chip to the second chip.

A guard ring is often formed around the TSV to protect the TSV, improve TSV performance, improve TSV structural stability, shield and/or reduce TSV-induced noise that can negatively impact the first chip and/or the second chip, or combinations thereof. The guard ring may be formed when forming a back-end-of-line (BEOL) structure of the first chip, such as first wiring of the first chip. The first wiring may be disposed over and connected to a first device substrate of the first chip and facilitate operation and/or electrical communication of devices and/or structures of the first device substrate. The TSV may be formed after forming the BEOL structure, for example, by etching through a dielectric layer of the BEOL structure in an area defined by the guard ring and through the first device substrate to form a TSV trench that exposes the second chip and filling the TSV trench with a conductive material. In some embodiments, the TSV trench may expose a BEOL structure of the second chip, which may be disposed over and connected to a second device substrate of the second chip and facilitate operation and/or electrical communication of devices and/or structures of the second device substrate. In some embodiments, the TSV trench extends from a top of the first device substrate to a distance above a bottom of the first device substrate. In such embodiments, a planarization process and/or a grinding process may be performed on the bottom of the first device substrate until reaching the TSV. The planarization process and/or the grinding process may be configured to remove a portion of the TSV to achieve a desired length and/or a desired depth of the TSV in the first device substrate. In some embodiments, a topmost metallization layer of the BEOL structure of the first chip is formed before and/or after the planarization process and/or the grinding process. The topmost metallization layer includes a top metal layer of the TSV that is physically and/or electrically connected to the guard ring. In some embodiments, first chip is attached to the second chip after forming the TSV and the topmost metallization layer.

Inserting the TSV into the first chip has been observed to generate stress in the first device substrate of the first chip at an interface region between the first device substrate and the BEOL structure of the first chip, particularly a portion of the interface region that includes the TSV and guard ring. The present disclosure proposes a TSV design, such as specific TSV dimensions, that can reduce such stress. In some embodiments, a TSV extends along a first direction through a first substrate that includes, for example, a BEOL structure and a device substrate. The TSV has a total length along the first direction and a width along a second direction that is different than the first direction. The total length is a sum of a first length of a first portion of the TSV and a second length of a second portion of the TSV. The first portion of the TSV is disposed in and extends through the BEOL structure and the second portion of the TSV is disposed in and extends through the device substrate. The first length is less than the second length, and the width is less than the first length. In some embodiments, a ratio of the first length to the second length is about 0.25 to about 0.5 to minimize stress at an interface region of the BEOL structure and the device substrate that includes the TSV and the guard ring. A ratio greater than about 0.5 indicates a shorter and/or shallower second portion of the TSV, which may undesirably increase stress at an interface between the BEOL structure (in particular, a dielectric layer of the BEOL structure) and the device substrate (e.g., a semiconductor substrate of the device substrate). A ratio less than about 0.25 indicates a shorter and/or shallower first portion of the TSV, which can increase stress on the TSV at the interface region. In some embodiments, a ratio of the width to the first length is about 0.5 to about 2.0. In some embodiments, the first length is greater than about 1.5 μm (for example, about 1.5 μm to about 2.5 μm). In some embodiments, the width is greater than about 1.5 μm (for example, about 1.5 μm to about 2.5 μm). In some embodiments, a distance between the TSV and the guard ring is about 0.2 μm to about 0.5 μm. Details of the proposed TSV structure and/or dimensions and/or fabrication thereof are described herein in the following pages. Different embodiments may have different advantages, and no particular advantage is required of any embodiment.

Figure 2:
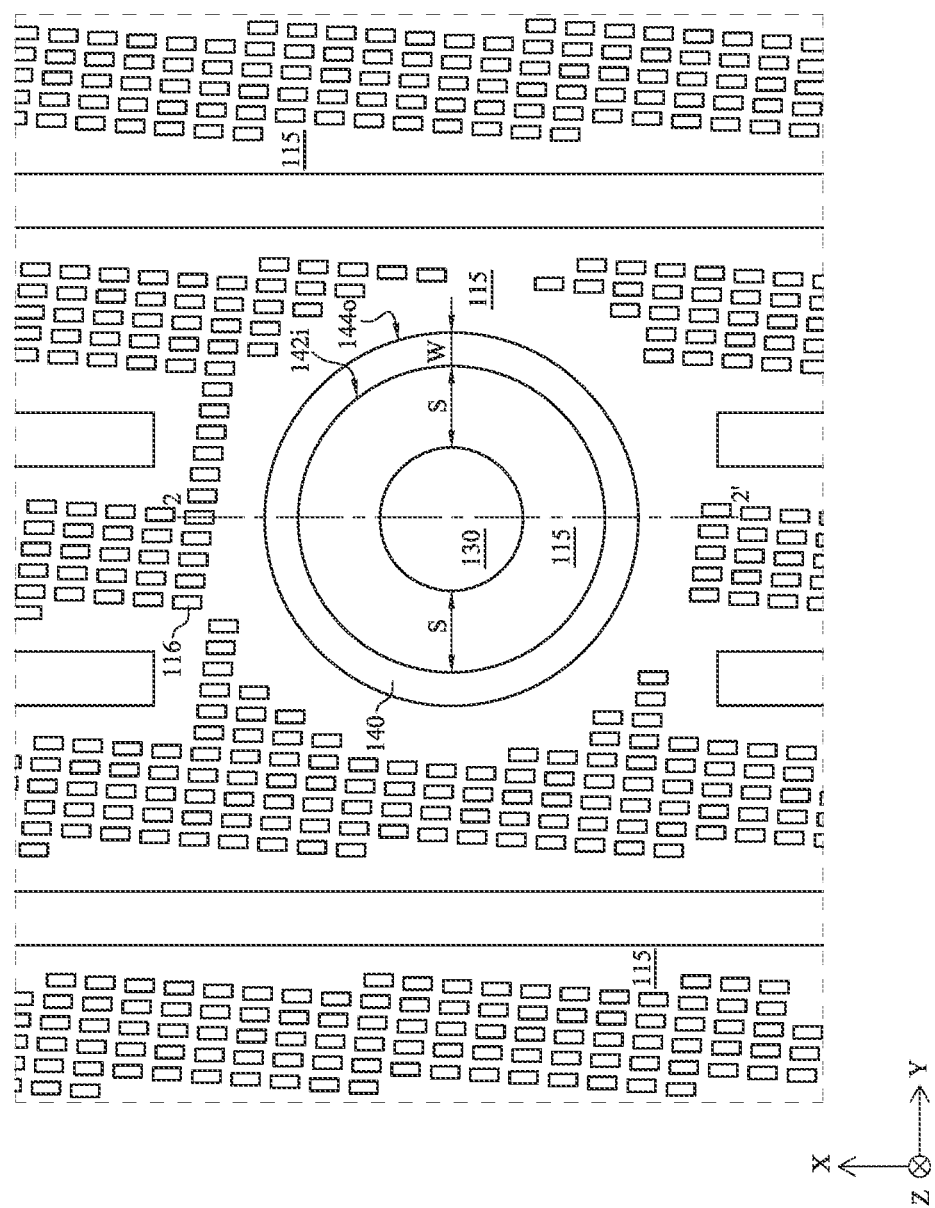
FIG. 2 is a fragmentary top view of the semiconductor structure of FIG. 1, in portion or entirety, according to various aspects of the present disclosure.
Figure 4:
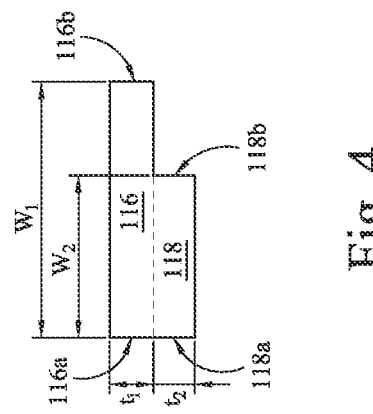
FIG. 3 and FIG. 4 are enlarged, cross-sectional views of portions of semiconductor structure of FIG. 1 and FIG. 2 according to various aspects of the present disclosure.
Figure 3:
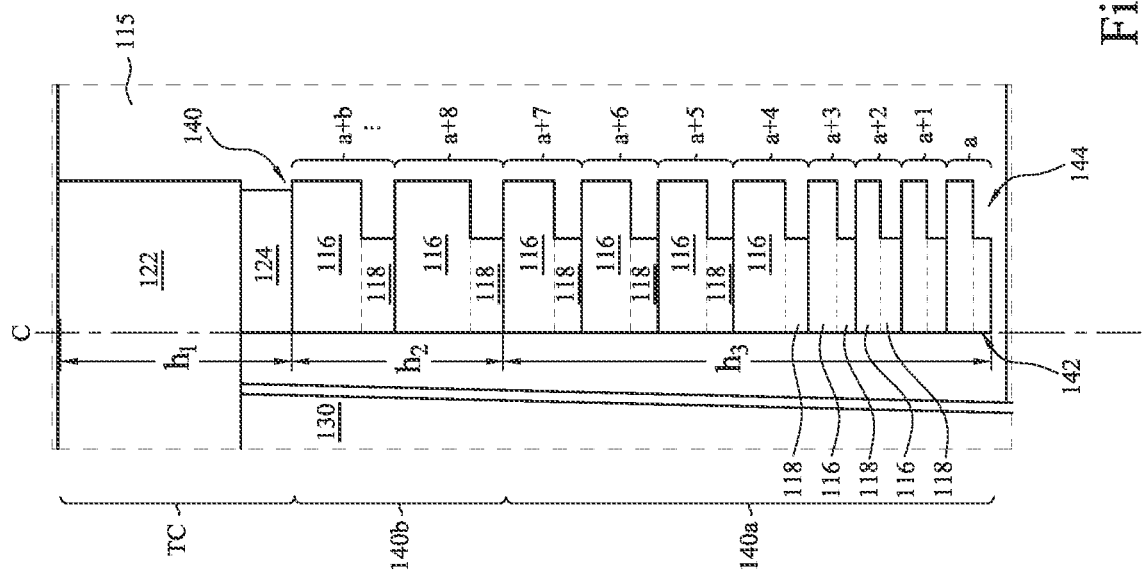
Figure 5A:
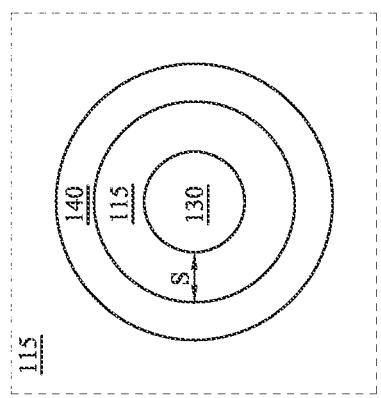
FIGS. 5A-5D are top views of guard rings and corresponding TSVs, in portion or entirety, that can be implemented in the semiconductor structure of FIG. 1 and FIG. 2 according to various aspects of the present disclosure.
Figure 5B:
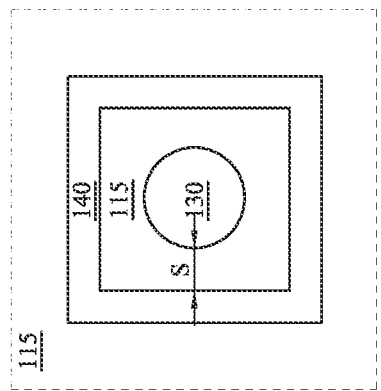
Figure 5C:
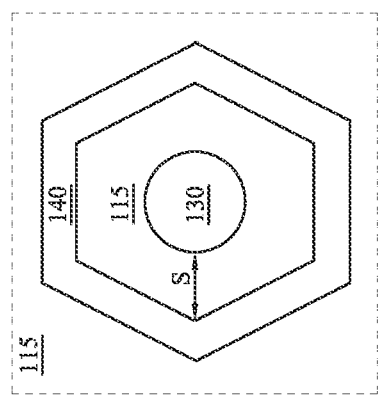
Figure 5D:
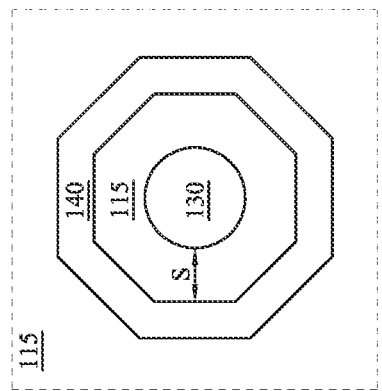
Figure 6:
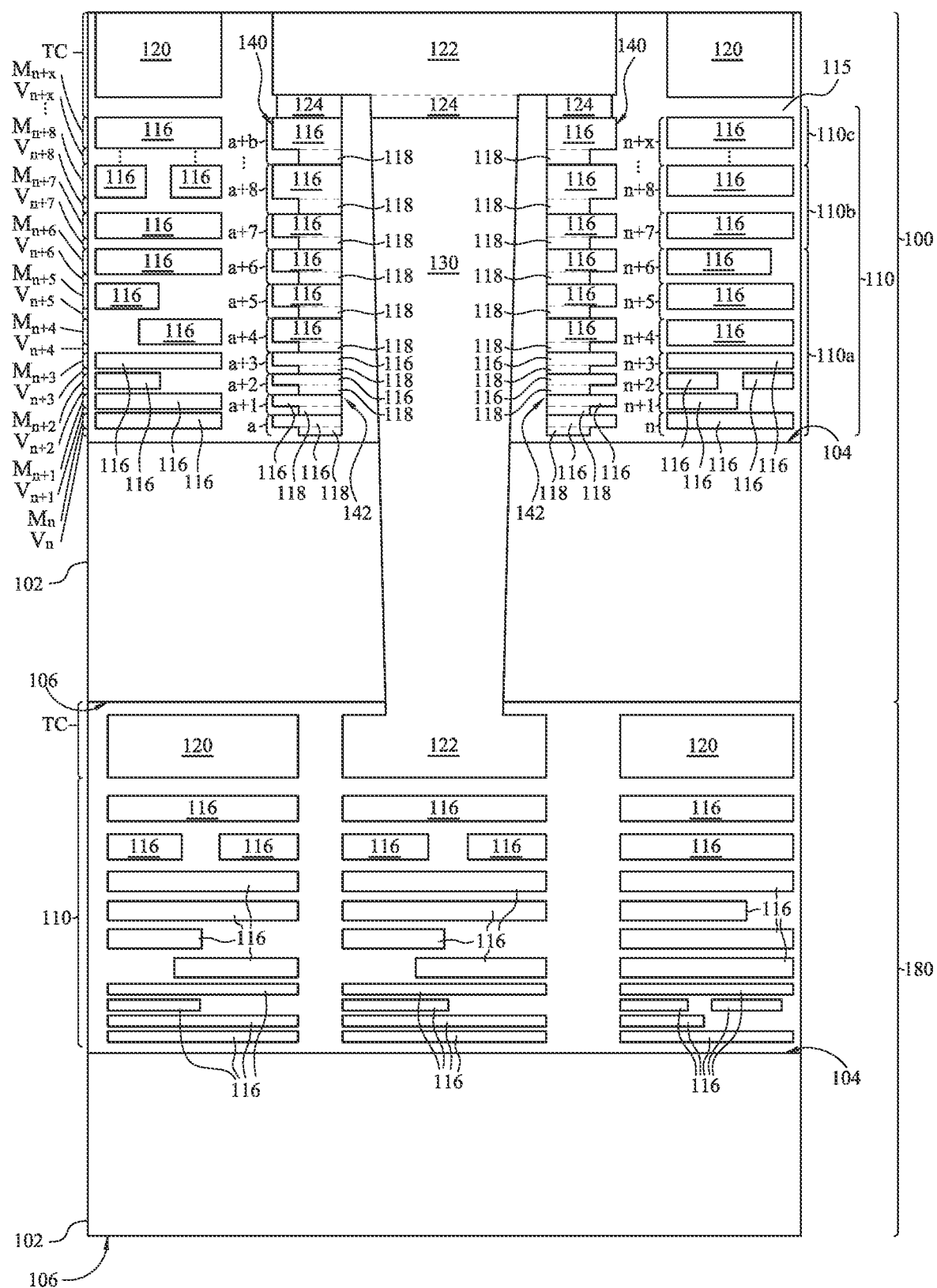
FIG. 6 is a fragmentary diagrammatic cross-sectional view of a semiconductor arrangement, in portion or entirety, that includes the semiconductor structure of FIG. 1 and FIG. 2, according to various aspects of the present disclosure.

FIG. 1 is a fragmentary cross-sectional view of a semiconductor structure 100 having an improved TSV design, in portion or entirety, according to various aspects of the present disclosure. FIG. 2 is a fragmentary top view of semiconductor structure 100 having the improved TSV design, in portion or entirety, according to various aspects of the present disclosure. The cross-sectional view of FIG. 1 is along line 2-2' of FIG. 2, and a top contact layer TC of semiconductor structure 100 depicted in FIG. 1 is removed in FIG. 2. FIG. 3 and FIG. 4 are enlarged, cross-sectional views of portions of semiconductor structure 100 of FIG. 1 and FIG. 2 according to various aspects of the present disclosure. FIGS. 5A-5D are top views of guard rings and corresponding TSVs, in portion or entirety, that can be implemented in semiconductor structure 100 of FIG. 1 and FIG. 2 according to various aspects of the present disclosure. FIG. 6 is a fragmentary diagrammatic cross-sectional view of a semiconductor arrangement, in portion or entirety, that includes semiconductor structure 100 of FIG. 1 and FIG. 2, according to various aspects of the present disclosure. FIG. 1, FIG. 2, FIG. 3, FIG. 4, FIGS. 5A-5D, and FIG. 6 are discussed concurrently herein for ease of description and understanding. FIG. 1, FIG. 2, FIG. 3, FIG. 4, FIGS. 5A-5D, and FIG. 6 have been simplified for the sake of clarity to better understand the inventive concepts of the present disclosure. Additional features can be added in semiconductor structure 100, and some of the features described below can be replaced, modified, or eliminated in other embodiments of semiconductor structure 100.

In FIG. 1, a device substrate 102 is depicted having a side 104 (e.g., a frontside) and a side 106 (e.g., a backside) that is opposite side 104. Device substrate 102 can include circuitry (not shown) fabricated on and/or over side 104 by front end-of-line (FEOL) processing. For example, device substrate 102 can include various device components/features, such as a semiconductor substrate, doped wells (e.g., n-wells and/or p-wells), isolation features (e.g., shallow trench isolation (STI) structures and/or other suitable isolation structures), metal gates (e.g., a metal gate having a gate electrode and a gate dielectric), gate spacers along sidewalls of the metal gate, source/drain features (e.g., epitaxial source/drains), other suitable device components/features, or combinations thereof. In some embodiments, device substrate 102 includes a planar transistor, where a channel of the planar transistor is formed in the semiconductor substrate between respective source/drains and a respective metal gate is disposed on the channel (e.g., on a portion of the semiconductor substrate in which the channel is formed). In some embodiments, device substrate 102 includes a non-planar transistor having a channel formed in a semiconductor fin that extends from the semiconductor substrate and between respective source/drains on/in the semiconductor fin, where a respective metal gate is disposed on and wraps the channel of the semiconductor fin (i.e., the non-planar transistor is a fin-like field effect transistor (FinFET)). In some embodiments, device substrate 102 includes a non-planar transistor having channels formed in semiconductor layers suspended over the semiconductor substrate and extending between respective source/drains, where a respective metal gate is disposed on and surrounds the channels (i.e., the non-planar transistor is a gate-all-around (GAA) transistor). The various transistors of device substrate 102 can be configured as planar transistors and/or non-planar transistors depending on design requirements.

Device substrate 102 can include various passive microelectronic devices and active microelectronic devices, such as resistors, capacitors, inductors, diodes, p-type FETs (PFETs), n-type FETs (NFETs), metal-oxide semiconductor (MOS) FETs (MOSFETs), complementary MOS (CMOS) transistors, bipolar junction transistors (BJTs), laterally diffused MOS (LDMOS) transistors, high voltage transistors, high frequency transistors, other suitable components, or combinations thereof. The various microelectronic devices can be configured to provide functionally distinct regions of an IC, such as a logic region (i.e., a core region), a memory region, an analog region, a peripheral region (e.g., an input/output (I/O) region), a dummy region, other suitable region, or combinations thereof. The logic region may be configured with standard cells, each of which can provide a logic device and/or a logic function, such as an inverter, an AND gate, an NAND gate, an OR gate, an NOR gate, a NOT gate, an XOR gate, an XNOR gate, other suitable logic device, or combinations thereof. The memory region may be configured with memory cells, each of which can provide a storage device and/or storage function, such as flash memory, non-volatile random-access memory (NVRAM), static random-access memory (SRAM), dynamic random-access memory (DRAM), other volatile memory, other non-volatile memory, other suitable memory, or combinations thereof. In some embodiments, memory cells and/or logic cells include transistors and interconnect structures that combine to provide storage devices/functions and logic devices/functions, respectively.

A multi-layer interconnect (MLI) feature 110 is disposed over side 104 of device substrate 102. MLI feature 110 electrically connects various devices (e.g., transistors) and/or components of device substrate 102 and/or various devices (e.g., a memory device disposed within MLI feature 110) and/or components of MLI feature 110, such that the various devices and/or components can operate as specified by design requirements. MLI feature 110 includes a combination of dielectric layers and electrically conductive layers (e.g., patterned metal layers) configured to form interconnect (routing) structures. The conductive layers form vertical interconnect structures, such as device-level contacts and/or vias, and/or horizontal interconnect structures, such as conductive lines. Vertical interconnect structures typically connect horizontal interconnect structures in different layers/levels (or different planes) of MLI feature 110. During operation, the interconnect structures can route electrical signals between devices and/or components of device substrate 102 and/or MLI feature 110 and/or distribute electrical signals (for example, clock signals, voltage signals, and/or ground signals) to the devices and/or the device components of device substrate 102 and/or MLI feature 110. Though MLI feature 110 is depicted with a given number of dielectric layers and metal layers, the present disclosure contemplates MLI feature 110 having more or less dielectric layers and/or metal layers.

MLI feature 110 can include circuitry fabricated on and/or over side 104 by back end-of-line (BEOL) processing and thus can also be referred to as a BEOL structure. MLI feature 110 includes an n level interconnect layer, an (n+x) level interconnect layer, and intermediate interconnect layer(s) therebetween (i.e., an (n+1) level interconnect layer, an (n+2) level interconnect layer, and so on), where n is an integer greater than or equal to 1 and x is an integer greater than or equal to 1. Each of n level interconnect layer to (n+x) level interconnect layer includes a respective metallization layer and a respective via layer. For example, n level interconnect layer includes a respective n via layer (denoted as $V_n$) and a respective n metallization layer (denoted as $M_n$) over n via layer, (n+1) level interconnect layer includes a respective (n+1) via layer (denoted as $V_{n+1}$) and a respective (n+1) metallization layer (denoted as $M_{n+1}$) over (n+1) via layer, and so on for the intermediate layers to (n+x) level interconnect layer, which includes a respective (n+x) via layer (denoted as $V_{n+x}$) and an (n+x) metallization layer (denoted as $M_{n+x}$) over (n+x) via layer. In the depicted embodiment, n equals 1, x equals 9, and MLI feature 110 includes ten interconnect layers, such as a $1^{st}$ level interconnect layer including a $V_1$ layer and an $M_1$ layer, a $2^{nd}$ level interconnect layer including a $V_2$ layer and an $M_2$ layer, and so on to a $10^{th}$ level interconnect layer including a $V_{10}$ layer and an $M_{10}$ layer. Each via layer physically and/or electrically connects an underlying metallization layer and an overlying metallization layer, an underlying device-level contact layer (e.g., a middle end-of-line (MEOL) interconnect layer, such as an $M_0$ layer) and an overlying metallization layer, an underlying device feature (e.g., a gate electrode of a gate or a source/drain) and an overlying metallization layer, or an underlying metallization layer and an overlying top contact layer. For example, $V_2$ layer is between, physically connected, and electrically connected to $M_1$ layer and $M_2$ layer. In another example, $V_1$ layer is between, physically connected, and electrically connected to $M_1$ layer and an underlying device-level contact layer and/or an underlying device feature. In some embodiments, the metallization layers and the via layers are further electrically connected to device substrate 102. For example, a first combination of metallization layers and via layers are electrically connected to a gate of a transistor of device substrate 102 and a second combination of metallization layers and via layers are electrically connected to a source/drain of the transistor, such that voltages can be applied to the gate and/or the source/drain.

MLI feature 110 includes a dielectric layer 115 having metal lines 116, vias 118, other conductive features, or combinations thereof disposed therein. Each of $M_n$ metallization layer to $M_{n+x}$ metallization layer includes a patterned metal layer (i.e., a group of metal lines 116 arranged in a desired pattern) in a respective portion of dielectric layer 115. Each of $V_n$ via layer to $V_{n+x}$ via layer includes a patterned metal layer (i.e., a group of vias 118 arranged in a desired pattern) in a respective portion of dielectric layer 115. Dielectric layer 115 includes a dielectric material, such as silicon oxide, tetraethylorthosilicate (TEOS) oxide, phosphosilicate glass (PSG), boron-doped silicate glass (BSG), boron-doped PSG (BPSG), low-k dielectric material (having, for example, a dielectric constant that is less than a dielectric constant of silicon oxide (e.g., k<3.9)), other suitable dielectric material, or combinations thereof. Exemplary low-k dielectric materials include fluorosilicate glass (FSG), carbon-doped oxide, Black Diamond® (Applied Materials of Santa Clara, California), xerogel, aerogel, amorphous fluorinated carbon, parylene, benzocyclobutene (BCB), SILK (Dow Chemical, Midland, Michigan), polyimide, other low-k dielectric material, or combinations thereof. In some embodiments, dielectric layer 115 includes a low-k dielectric material, such as carbon-doped oxide, or an extreme low-k dielectric material (e.g., k≤2.5), such as porous carbon-doped oxide.

Dielectric layer 115 can have a multilayer structure. For example, dielectric layer 115 includes at least one interlevel dielectric (ILD) layer, at least one contact etch stop layer (CESL) disposed between respective ILD layers, and at least one CESL disposed between a respective ILD layer and device substrate 102. In such embodiments, a material of the CESL is different than a material of the ILD layer. For example, where the ILD layer includes a low-k dielectric material, the CESL can include silicon and nitrogen (e.g., silicon nitride, silicon oxynitride, silicon carbonitride, or combinations thereof) or other suitable dielectric material. The ILD layer and/or the CESL may have a multilayer structure having multiple dielectric materials. In some embodiments, each of n level interconnect layer to (n+x) level interconnect layer includes a respective ILD layer and/or a respective CESL of dielectric layer 115, and respective metal lines 116 and vias 118 are in the respective ILD layer and/or the respective CESL. In some embodiments, each of $M_n$ layer to $M_{n+x}$ layer includes a respective ILD layer and/or a respective CESL of dielectric layer 115, where respective metal lines 116 are in the respective ILD layer and/or the respective CESL. In some embodiments, each of $V_n$ layer to $V_{n+x}$ layer includes a respective ILD layer and/or a respective CESL of dielectric layer 115, where respective vias 118 are in the respective ILD layer and/or the respective CESL.

A top contact (TC) layer is disposed over MLI feature 110, and in the depicted embodiment, is disposed over a topmost metallization layer of MLI feature 110 (i.e., $M_{10}$ layer). TC layer includes patterned metal layers in a respective portion of dielectric layer 115. For example, TC layer includes a contact layer, which includes contacts 120 and a contact 122 arranged in a desired pattern, and a via layer, which includes vias 124 arranged in a desired pattern. The via layer (e.g., vias 124) physically and/or electrically connects the contact layer (e.g., contacts 120 and contact 122) to MLI feature 110 (e.g., metal lines 116 of $M_{n+x}$ layer). Contacts 120 and/or contact 122 may facilitate electrical connection of MLI feature 110 and/or device substrate 102 to external circuitry and thus may be referred to as external contacts. In some embodiments, contacts 120 and/or contact 122 are under-bump metallization (UBM) structures. In some embodiments, dielectric layer 115 includes at least one passivation layer, such as a passivation layer disposed over topmost metallization layer of MLI feature 110 (e.g., $M_{10}$ layer). In such embodiments, TC layer may include the passivation layer, where contacts 120, contact 122, and vias 124 are disposed in the passivation layer. The passivation layer includes a material that is different than a dielectric material of an underlying ILD layer of MLI feature 110. In some embodiments, the passivation layer includes polyimide, undoped silicate glass (USG), silicon oxide, silicon nitride, other suitable passivation material, or combinations thereof. In some embodiments, a dielectric constant of a dielectric material of the passivation layer is greater than a dielectric constant of a topmost ILD layer of MLI feature 110. The passivation layer may have a multilayer structure having multiple dielectric materials. For example, the passivation layer can include a silicon nitride layer and a USG layer.

Metal lines 116, vias 118, contacts 120, contact 122, and vias 124 include a conductive material, including for example, aluminum, copper, titanium, tantalum, tungsten, ruthenium, cobalt, iridium, palladium, platinum, nickel, tin, gold, silver, other suitable metals, alloys thereof, silicides thereof, or combinations thereof. In some embodiments, metal lines 116, vias 118, contacts 120, contact 122, vias 124, or combinations thereof include a bulk metal layer (also referred to as a metal fill layer, a conductive plug, a metal plug, or combinations thereof). In some embodiments, metal lines 116, vias 118, contacts 120, contact 122, vias 124, or combinations thereof include a barrier layer, an adhesion layer, and/or other suitable layer disposed between the bulk metal layer and dielectric layer 115. The barrier layer can include titanium, titanium alloy (e.g., TiN), tantalum, tantalum alloy (e.g., TaN), other suitable barrier material (e.g., a material that can prevent diffusion of metal constituents from metal lines 116, vias 118, contacts 120, contact 122, vias 124, or combinations thereof into dielectric layer 115), or combinations thereof. In some embodiments, metal lines 116, vias 118, contacts 120, contact 122, vias 124, or combinations thereof include different metal materials. For example, lower metal lines 116 and/or vias 118 of MLI feature 110 can include tungsten, ruthenium, cobalt, or combinations thereof, while higher metal lines 116 and/or vias 118 of MLI feature 100 can include copper. In some embodiments, metal lines 116, vias 118, contacts 120, contact 122, vias 124, or combinations thereof include the same metal materials.

Each metallization layer is a patterned metal layer having metal lines 116, where the patterned metal layer has a corresponding pitch. Metallization layers of MLI feature 110 can thus be grouped by their respective pitches. A pitch of a patterned metal layer generally refers to a sum of a width of metal lines (e.g., metal lines 116) of the patterned metal layer and a spacing between directly adjacent metal lines of the patterned metal layer (i.e., a lateral distance between edges of directly adjacent metal lines 116 of the patterned metal layer). In some embodiments, a pitch of the patterned metal layer is a lateral distance between centers of directly adjacent metal lines 116 of the patterned metal layer. Metallization layers having a same pitch may be grouped together. For example, in FIG. 1, MLI feature 110 has a set 18A of metallization layers (e.g., $M_1$ layer through $M_8$ layer) having a pitch P1 and a set 18B of metallization layers (e.g., $M_9$ layer and $M_{10}$ layer) having a pitch P2. Pitch P1 and pitch P2 are different. In the depicted embodiment, pitch P1 is less than pitch P2, such that pitch of metallization layers in dielectric layer 115 increases as distance increases between the metallization layers and front side 104 of device substrate 102. The present disclosure contemplates other variations of pitch P1, pitch P2, and/or pitch P3 (e.g., pitch P1 is greater than pitch P2 and pitch P3). MLI feature 110 can include any number of metallization layer sets (groups) having different pitches depending on IC technology node and/or IC generation (e.g., 20 nm, 5 nm, etc.). In some embodiments, MLI feature 110 includes three sets to six sets of metallization layers having different pitches.

A through substrate via (TSV) 130 (also referred to as a through silicon via or a through semiconductor via) is disposed in dielectric layer 115. TSV 130 is physically and/or electrically connected to a respective contact 122, which is also physically and electrically connected to a guard ring 140. In FIG. 1, a respective via 124 of TC layer physically and electrically connects TSV 130 to contact 122. The respective via 124 may be a portion of TSV 130 that is formed when forming TSV 130 or when forming TC layer. TSV 130 extends from contact 122, through dielectric layer 115, and through device substrate 102. TSV 130 extends from side 104 to side 106 of device substrate 102, such that TSV 130 extends entirely through device substrate 102. TSV 130 has a total length H (which can also be referred to as a height of TSV 130) along the z-direction. Total length H is between contact 122 and side 106 of device substrate 102. Total length H is a sum of a length of TSV 130 in dielectric layer 115 (e.g., a length (and/or height) $H_a$) and a length of TSV 130 in device substrate 102 (e.g., a length (and/or height) $H_b$). TSV 130 also has a width $D_{TSV}$ along the x-direction. In the depicted embodiment, TSV 130 has a circular shape in a top view (FIG. 2 and FIG. 5A) and width $D_{TSV}$ represents a diameter of TSV 130. In such embodiments, TSV 130 may be a cylindrical structure that extends through dielectric layer 115. TSV 130 may have different shapes in a top view, such as a square shape, a rhombus shape, a trapezoidal shape, a hexagonal shape, an octagonal shape, or other suitable shape. In some embodiments, width $D_{TSV}$ is substantially the same along length H of TSV 130 (e.g., along the z-direction). In some embodiments, width $D_{TSV}$ varies along length H. For example, in FIG. 1, TSV 130 has slightly tapered sidewalls, such that width $D_{TSV}$ decreases from a top of TSV 130 (interfacing with contact 122) to a bottom of TSV 130 (at side 106 of device substrate 102). In some embodiments, width $D_{TSV}$ increases or decreases along length $H_a$ in dielectric layer 115 but is substantially the same along length $H_b$ in device substrate 102, or vice versa. The present disclosure contemplates TSV 130 having any variation of width $D_{TSV}$ along its length H depending on sidewall configuration (e.g., tapered sidewalls, substantially vertical sidewalls, non-linear sidewalls (having, for example, one or more curvilinear segments), sidewalls having a stepped profile, sidewalls having other suitable profiles, or combinations thereof).

TSV 130 includes a conductive material, including for example, aluminum, copper, titanium, tantalum, tungsten, ruthenium, cobalt, iridium, palladium, platinum, nickel, tin, gold, silver, other suitable metals, alloys thereof, silicides thereof, or combinations thereof. In some embodiments, TSV 130 includes a bulk metal layer (also referred to as a metal fill layer, a conductive plug, a metal plug, or combinations thereof) and a barrier layer, where the barrier layer is disposed between the bulk metal layer and dielectric layer 115. The barrier layer can include titanium, titanium alloy (e.g., TiN), tantalum, tantalum alloy (e.g., TaN), other suitable barrier material (e.g., a material that can prevent diffusion of metal constituents from TSV 130 into dielectric layer 115), or combinations thereof. In some embodiments, the bulk metal layer is a copper plug or a tungsten plug, and the barrier layer is a metal nitride layer (e.g., TaN layer or TiN layer). In some embodiments, the bulk metal layer includes a seed layer between the barrier layer and the metal plug. The seed layer can include copper, tungsten, other suitable metals (such as those described herein), alloys thereof, or combinations thereof. In some embodiments, TSV 130 includes a dielectric liner between the bulk metal layer or the barrier layer and dielectric layer 115. The dielectric liner includes silicon oxide, silicon nitride, other suitable dielectric material, or combinations thereof. The bulk metal layer, the barrier layer, the seed layer, the dielectric liner, or combinations thereof may have a multi-layer structure. In some embodiments, TSV 130 includes polysilicon (e.g., the metal plug is a polysilicon plug).

Different coefficients of thermal expansion (CTE) of TSV 130, guard ring 140, insulator layers (e.g., dielectric layer 115 and/or dielectric liner of TSV 130), and device substrate 102 (e.g., silicon substrate of device substrate 102, which surrounds TSV 130) can induce thermal stresses and/or mechanical stresses within and/or around TSV 130 that degrade reliability of TSV 130 and thus reliability of semiconductor structure 100. Such stresses may result during and/or after fabrication of TSV 130 and are especially prevalent when TSV 130 is a metal-filled TSV, such as a copper TSV. For example, temperature differences experienced by semiconductor structure 100 during and/or after fabrication can cause structural changes (e.g., grain size and/or grain boundary changes) and/or induce thermomechanical stresses in TSV 130 and/or semiconductor structure 100. The structural changes and/or the thermomechanical stresses can induce cracking in TSV 130, dielectric layer 115, and/or device substrate 102. The structural changes and/or the thermomechanical stresses can cause separation of TSV 130 and dielectric layer 115 and/or separation of TSV 130 and device substrate 102. In other words, delamination may occur at metal/dielectric interfaces (e.g., TSV 130/dielectric layer 115), metal/semiconductor interfaces (e.g., TSV 130/semiconductor substrate of device substrate 102), semiconductor/dielectric interfaces (e.g., semiconductor substrate of device substrate 102/dielectric layer 115), or combinations thereof of semiconductor structure 100.

The present disclosure recognizes that TSV insertion depth impacts an amount of stress generated in semiconductor structure 100 and a distribution of such stress in semiconductor structure 100, particularly at an interface region IF. The present disclosure thus proposes tuning the TSV insertion depth to reduce and/or eliminate stress generated from, within, and/or around TSV 130, device substrate 102, guard ring 140, semiconductor structure 100, or combinations thereof. For example, length $H_a$ is configured less than length $H_b$ to provide a TSV insertion depth in dielectric layer 115 that is less than a TSV insertion depth in device substrate 102 (i.e., in silicon). Configuring semiconductor structure 100 with a shallower TSV insertion depth in dielectric layer 115 than device substrate 102 can improve stress distribution and/or reduce stress from, within, and/or around TSV 130, device substrate 102, guard ring 140, other component of semiconductor structure 100, or combinations thereof. The shallower TSV insertion depth in dielectric layer 115 compared to device substrate 102 can also reduce an impact of such stress on TSV 130, device substrate 102, guard ring 140, other component of semiconductor structure 100, or combinations thereof.

As a ratio of length $H_a$ to length $H_b$ increases (which corresponds with a TSV insertion depth of TSV 130 in device substrate 102 that decreases while a TSV insertion depth of TSV 130 in dielectric layer 115 increases), stress tends to concentrate at interfaces between device substrate 102 and dielectric layer 115 (i.e., silicon/dielectric interfaces). As the ratio of length $H_a$ to length $H_b$ decreases (which corresponds with a TSV insertion depth of TSV 130 in device substrate 102 that increases while a TSV insertion depth of TSV 130 in dielectric layer 115 decreases), stress tends to concentrate on TSV 130. Considering such, in the depicted embodiment, TSV 130 is configured with a ratio of length $H_a$ to length $H_b$ that is about 0.25 to about 0.5 (i.e., $0.5 \geq H_a/H_b \geq 0.25$) to optimize TSV insertion depth, minimize stress in semiconductor structure 100, optimize stress distribution in semiconductor structure 100 (in particular, at interface region IF), or combinations thereof. For example, ratios of length $H_a$ to length $H_b$ that are greater than 0.5 (i.e., $H_a/H_b > 0.5$) provide a relatively shallow TSV insertion depth in device substrate 102, which undesirably increases and/or distributes stress at interfaces between device substrate 102 and dielectric layer 115, while ratios of length $H_a$ to length $H_b$ that are less than 0.25 (i.e., $H_a/H_b < 0.25$) provide a relatively deep TSV insertion depth in device substrate 102 (i.e., a bulk (majority) of TSV 130 is in device substrate 102), which undesirably increases and/or distributes stress on TSV 130. Ratios of length $H_a$ to length $H_b$ that are about 0.25 to about 0.5 thus balance stress from, within, and/or around TSV 130 and from, within, and/or around interfaces between device substrate 102 and dielectric layer 115. When forming TSV trenches for TSVs, such as TSV 130, on a wafer, ratios of length $H_a$ to length $H_b$ that are about 0.25 to about 0.5 provide improved etching process control, thereby providing TSV trenches (and thus subsequently formed TSVs) with dimensions, such as depths and/or widths, that are substantially uniform across the wafer. Ratios of length $H_a$ to length $H_b$ that are less than 0.25 and/or greater than 0.5 provide less (and sometimes poor) etching process control, which results in TSV trenches (and subsequently formed TSVs) having different dimensions across a wafer and/or dimensions that are different than pre-defined dimensions for the trenches.

TSV 130 is also configured with a ratio of width $D_{TSV}$ to length $H_a$ that is about 0.5 to about 2 (i.e., $2 \geq D_{TSV}/H_a \geq 0.5$) to optimize etching process control, optimize TSV insertion depth, minimize stress in semiconductor structure 100, optimize stress distribution in semiconductor structure 100 (in particular, at interface region IF), or combinations thereof. Ratios of width $D_{TSV}$ to length $H_a$ that are less than 0.5 and/or greater than 2 provide less (and sometimes poor) etching process control, which results in TSV trenches (and subsequently formed TSVs) having different dimensions across a wafer and/or dimensions that are different than pre-defined dimensions for the trenches. In some embodiments, width $D_{TSV}$ is greater than about 1.5 µm. For example, width $D_{TSV}$ is about 1.5 µm to about 2.5 µm (i.e., $2.5 \geq D_{TSV} \geq 1.5$) to optimize etching process control, minimize etch-induced defects, or combinations thereof. In some embodiments, length $H_a$ is greater than about 1.5 µm. For example, length $H_a$ is about 1.5 µm to about 2.5 µm (i.e., $2.5 \geq H_a \geq 1.5$) to balance stress from, within, and/or around TSV 130, balance stress from, within, and/or around interfaces between device substrate 102 and dielectric layer 115, optimize etching process control, or combinations thereof. Widths $D_{TSV}$ and/or lengths $H_a$ that are less than 1.5 µm and/or greater than 2.5 µm may provide less (and sometimes poor) etching process control, which results in TSV trenches (and subsequently formed TSVs) having different dimensions across a wafer and/or dimensions that are different than pre-defined dimensions for the TSV trenches. Widths $D_{TSV}$ that are less than 1.5 µm may result in TSV trenches having aspect ratios (i.e., a ratio of a height (length) of a trench to a width of a trench) that are too large, which can reduce etching process control and/or degrade metal-fill capability (i.e., it may be difficult to adequately fill TSV trenches having aspect ratios that are too large with conductive material, resulting in TSVs having air gaps and/or voids therein). Widths $D_{TSV}$ that are greater than 2.5 µm may result in open areas (i.e., exposed portions of dielectric layer 115 and/or device substrate 102 when forming TSV trenches) that increase susceptibility of semiconductor structure 100 to etching-induced defects, such as micro-masking (e.g., where sputtered mask material and/or etch reaction byproducts redeposit on a wafer and act as a micromask during etching and/or cause bridging defects).

Guard ring 140 is disposed in dielectric layer 115 and around TSV 130. Guard ring 140 extends through dielectric layer 115 from TC layer to side 104 of device substrate 102. Guard ring 140 is physically and/or electrically connected to TC layer. For example, vias 124 physically and electrically connect guard ring 140 to contact 122, which as noted above is also physically and/or electrically connected to TSV 130. Guard ring 140 may be physically and/or electrically connected to device substrate 102. For example, an MEOL layer (i.e., device-level contacts and/or vias) can physically and/or electrically connect guard ring 140 to device substrate 102, such as to a doped region (e.g., an n-well and/or a p-well) in device substrate 102. In some embodiments, guard ring 140 is electrically connected to a voltage. In some embodiments, guard ring 140 is electrically connected to an electrical ground. In some embodiments, guard ring 140 is configured to electrically insulate TSV 130 from MLI feature 110, device substrate 102, other device features and/or device components, or combinations thereof. In some embodiments, guard ring 140 absorbs thermomechanical stress from, within, and/or around TSV 130. In some embodiments, guard ring 140 reduces thermomechanical stress from, within, and/or around TSV 130. In some embodiments, guard ring 140 reduces or eliminates cracking and/or delamination in semiconductor structure 100. In some embodiments, guard ring 140 provides structural support, integrity, reinforcement, or combinations thereof for TSV 130.

Guard ring 140 has a width $D_b$ along the x-direction. From a top view (FIG. 2 and FIG. 5A), guard ring 140 is a circular ring around TSV 130, and guard ring 140 extends continuously around TSV 130. In such embodiments, width $D_b$ represents an inner diameter of guard ring 140. In some embodiments, guard ring 140 has other shapes in a top view, such as those depicted in FIGS. 5B-5D. For example, guard ring 140 may be a square ring (FIG. 5B), a hexagonal ring (FIG. 5C), an octagonal ring (FIG. 5D), or other suitable shaped ring. In some embodiments, guard ring 140 is discontinuous (e.g., a ring formed from discrete segments).

Guard ring 140 is separated from TSV 130 by dielectric layer 115. A spacing S (also referred to as a distance) along the x-direction is between guard ring 140 and TSV 130. In some embodiments, spacing S is about 0.2 µm to about 0.5 µm to maximize protection and/or shielding provided by guard ring 140 to TSV 130. Spacing S greater than 0.5 µm is too large and prevents guard ring 140 from sufficiently protecting TSV 130. For example, when guard ring 140 is spaced too far from (e.g., greater than 0.5 µm from) TSV 130, guard ring 140 cannot sufficiently absorb and/or reduce stresses from, within, and/or around TSV 130. Stresses may then undesirably concentrate on TSV 130, which can degrade performance and/or structural integrity of TSV 130. Spacing S less than 0.2 µm is too small and can result in a physical connection between guard ring 140 and TSV 130, which negates a purpose and/or a function of guard ring 140. For example, when guard ring 140 is spaced too close to (e.g., less than 0.2 µm from) TSV 130, guard ring 140 is essentially an extension of TSV 130 (and forms a portion thereof) and cannot protect TSV 130 as intended. For example, guard ring 140 cannot provide electrical insulation; reduce or eliminate stress from, within, and/or around TSV 130; reduce or eliminate cracking; provide structural integrity; or combinations thereof. In some embodiments, a ratio of dimension $D_b$ to dimension $D_{TSV}$ is configured to optimize spacing S.

Guard ring 140 is fabricated in conjunction with MLI feature 110, and guard ring 140 may be considered a portion of MLI feature 110. For example, guard ring 140 includes a stack of interconnect structures, where the interconnect structures are vertically stacked along the z-direction (or along a lengthwise direction of TSV 130). Each interconnect structure includes a respective metal line 116 and a respective via 118. In FIG. 1, the stack of interconnect structures includes an a interconnect structure, an (a+b) interconnect structure, and intermediate interconnect structure(s) therebetween (i.e., an (a+1) interconnect structure, an (a+2) interconnect structure, and so on), where a is an integer greater than or equal to 1 and b is an integer greater than or equal to 1. In the depicted embodiment, a is equal to n (e.g., a=1), b is equal to x (e.g., b=9), and guard ring 140 has an interconnect structure that corresponds with each level interconnect layer of MLI feature 110. For example, a interconnect structure forms a conductive ring around TSV 130 in n level interconnect layer, (a+1) interconnect structure forms a conductive ring around TSV 130 in (n+1) level interconnect layer, and so on for the intermediate interconnect structures, and (a+b) interconnect structure forms a conductive ring around TSV 130 in (n+x) level interconnect layer. The present disclosure contemplates guard ring 140 having a number of interconnect structures that is more or less than a number of levels of interconnect layers of MLI feature 110. For example, guard ring 140 may extend from (n+x) level interconnect layer to (n+5) interconnect layer of MLI feature 110.

In FIGS. 1-3, guard ring 140 has an inner sidewall 142 (i.e., sidewall of guard ring 140 that is closest to TSV 130) and an outer sidewall 144 (i.e., sidewall of guard ring 140 that is opposite inner sidewall 142). In a top view, inner sidewall 142 and outer sidewall 144 form an innermost ring 142i and an outermost ring 144o, respectively. Guard ring 140 has a width w between inner sidewall 142 (and/or innermost ring 142i) and outer sidewall 144 (and/or outermost ring 144o). Width $D_b$ is defined by inner sidewall 142 (and/or innermost ring 142i), and spacing S is between inner sidewall 142 (and/or innermost ring 142i) and TSV 130. In a cross-sectional view, inner sidewall 142 extends along the z-direction and is formed by TSV-facing sidewalls of interconnect structures of guard ring 140 (i.e., TSV-facing sidewalls of metal lines 116 and/or TSV-facing sidewalls of vias 118 of the interconnect structures), and outer sidewall 144 extends along the z-direction and is formed by sidewalls of interconnect structures of guard ring 140 that are opposite the TSV-facing sidewalls (i.e., sidewalls of metal lines 116 and/or sidewalls of vias 118 that are opposite TSV-facing sidewalls of metal lines 116 and TSV-facing sidewalls of vias 118, respectively). The interconnect structures are arranged to substantially vertically align the TSV-facing sidewalls of metal lines 116 thereof, such that inner sidewall 142 has a substantially vertical cross-sectional profile. For example, in FIG. 3, a line C is an axis along the z-direction that represents a substantially vertical sidewall and TSV-facing sidewalls of a interconnect structure a to (a+b) interconnect structure of guard ring 140, which form inner sidewall 142 of guard ring 140, are vertically aligned with line C. In some embodiments, inner sidewall 142 is considered substantially vertical when any lateral shift of inner sidewall 142 from line C is less than about 0.01 µm. For example, if a TSV-facing sidewall of an interconnect structure of guard ring (e.g., TSV-facing sidewall of metal line 116 and/or TSV-facing sidewall of via 118) is shifted laterally left or right from line C (i.e., the TSV-facing sidewall is not vertically aligned with line C), an amount of any such shift (i.e., a lateral distance) is ±0.01 µm.

In some embodiments, TC layer has a height (length) $h_1$ along the z-direction, interconnect structures, metal lines 116, vias 118, or combinations thereof of guard ring 140 are divided into groups (or sets), and TC layer and the groups of guard ring 140 are configured with different thicknesses (also referred to as heights or lengths) along the z-direction to optimize TSV insertion depth, minimize stress in semiconductor structure 100, optimize stress distribution in semiconductor structure 100 (in particular, at interface region IF), or combinations thereof. For example, in FIG. 1 and FIG. 3, interconnect structures of guard ring 140 are grouped into a set 140a of interconnect structures and a set 140b of interconnect structures, where set 140b is between TC layer and set 140a. Set 140a includes a interconnect structure through (a+7) interconnect structure and set 140b includes (a+8) interconnect structure and (a+b) interconnect structure. Set 140a has a height (length) $h_3$ along the z-direction and set 140b has a height (length) $h_2$ along the z-direction. In some embodiments, height $h_1$ is greater than height $h_3$ and height $h_3$ is greater than height $h_2$ to optimize TSV insertion depth, minimize stress in semiconductor structure 100, optimize stress distribution in semiconductor structure 100 (in particular, at interface region IF), or combinations thereof. In some embodiments, groups of interconnect structures of guard ring 140 are determined based on a pitch of a metallization layer to which the interconnect structures belong. For example, set 140a of interconnect structures corresponds with set 110a of metallization layers having pitch P1 and set 140b of interconnect structures corresponds with set 110b of metallization layers having pitch P2.

As noted above, each interconnect structure of guard ring 140 has a respective metal line 116 and a respective via 118. FIG. 4 depicts an exemplary interconnect structure, which represents any of a interconnect structure to (a+b) interconnect structure of guard ring 140. In FIG. 4, metal line 116 of the interconnect structure has a width $W_1$ along the x-direction and a thickness $t_1$ along the z-direction, and via 118 of the interconnect structure of guard ring 140 has a width $W_2$ along the x-direction and a thickness $t_2$ along the z-direction. Metal line 116 has a sidewall 116a (e.g., a TSV-facing sidewall) and a sidewall 116b (e.g., a sidewall opposite the TSV-facing sidewall), and width $W_1$ is between sidewall 116a and sidewall 116b. Via 118 has a sidewall 118a (e.g., a TSV-facing sidewall) and a sidewall 118b (e.g., a sidewall opposite the TSV-facing sidewall), and width $W_2$ is between sidewall 118a and sidewall 118b. Width $W_1$ is greater than width $W_2$. Thickness t2 is greater than, less than, or equal to thickness t1.

Metal line 116 and via 118 are vertically oriented to vertically align sidewall 116a and sidewall 118a of metal line 116 and via 118, respectively. In other words, the interconnect structure is configured with vertically aligned TSV-facing sidewalls, which form a portion of inner sidewall 142. When the TSV-facing sidewalls are vertically aligned and width $W_1$ is different than width $W_2$, such as depicted, sidewalls opposite the TSV-facing sidewalls, which form a portion of outer sidewall 144, are not vertically aligned. For example, sidewall 116b of metal line 116 is not vertically aligned with sidewall 118b of via 118. In some embodiments, a ratio of width $W_1$ to width $W_2$ is greater than one to provide metal line 116 and via 118 with different widths, which can minimize stress within, from, and/or around guard ring 140 by preventing vertical alignment of both the TSV-facing sidewalls (i.e., sidewall 116a and sidewall 118a) and the sidewalls opposite the TSV-facing sidewalls (e.g., sidewall 116b and sidewall 118b). Where the ratio of width $W_1$ to width $W_2$ is equal to 1 (i.e., width $W_1$ equals width $W_2$) and metal line 116 is vertically aligned with via 118, both the TSV-facing sidewalls and the sidewalls opposite the TSV-facing sidewalls of metal line 116 and via 118 are vertically aligned, which prevents adequate release of stress within, from, and/or around guard ring 140. In some embodiments, the ratio of width $W_1$ to width $W_2$ is equal to 1, but metal line 116 and via 118 are vertically oriented in a manner that precludes vertical alignment of their sidewalls.

In some embodiments, metal lines 116 of guard ring 140 have the same width. In some embodiments, metal lines 116 of guard ring 140 have different widths (e.g., different widths $W_1$) and interconnect structures of guard ring 140 are vertically oriented to provide vertical alignment of TSV-facing sidewalls of metal lines 116, such that inner sidewall 142 is substantially vertical and/or substantially linear. In such embodiments, a non-uniform profile of outer sidewall 144 depends on how widths $W_1$ of metal lines 116 vary along height $H_a$ of TSV 130. For example, outer sidewall 144 may have a stair profile, a tapered profile, a zig-zag profile, a wavy profile, a curvilinear profile, other suitable profile, or combinations thereof. In some embodiments, widths of metal lines 116 of guard ring 140 increase along height $H_a$ of TSV 130 (i.e., widths of metal lines 116 of guard ring 140 increase from side 104 of device substrate 102 to contact 122). For example, width $W_1$ of metal lines 116 of guard ring 140 increases from a first width to a second width along height $H_a$. In such embodiments, width $W_1$ of metal line 116 of a interconnect structure may be equal to the first width, width $W_1$ of metal line 116 of (a+b) interconnect structure may be equal to the second width, and width $W_1$ of metal lines 116 of intermediate interconnect structures may be between the first width and the second width. In some embodiments, widths of metal lines 116 of guard ring 140 decrease along height $H_a$ of TSV 130 (i.e., widths of metal lines 116 of guard ring 140 decrease from side 104 of device substrate 102 to contact 122). In some embodiments, metal lines 116 of interconnect structures of a same set of guard ring 140 have the same width, but the sets have different widths and interconnect structures of guard ring 140 are vertically oriented to provide vertical alignment of TSV-facing sidewalls of metal lines 116 of the sets. For example, width $W_1$ of metal lines 116 of set 140a may be equal to a first width and width $W_1$ of metal lines 116 of set 140b may be equal to a second width, where the first width and the second width are different. In some embodiments, the first width is greater than the second width. In some embodiments, the first width is less than the second width. In some embodiments, metal lines 116 of interconnect structures of a same set of guard ring 140 have different widths, and sidewalls of metal lines 116 of the set forming inner sidewall 142 are substantially vertically aligned. For example, width $W_1$ of metal lines 116 of set 140a are different but TSV-facing sidewalls of metal lines 116 of set 140a vertically align.

In some embodiments, vias 118 of guard ring 140 have the same width. In some embodiments, vias 118 of guard ring 140 have different widths (e.g., different widths $W_2$) and interconnect structures of guard ring 140 are vertically oriented to provide vertical alignment of TSV-facing sidewalls of vias 118, such that inner sidewall 142 is substantially vertical and/or substantially linear. In such embodiments, a non-uniform profile of outer sidewall 144 depends on how widths $W_2$ of vias 118 vary along height $H_a$ of TSV 130. For example, outer sidewall 144 may have a stair profile, a tapered profile, a zig-zag profile, a wavy profile, a curvilinear profile, other suitable profile, or combinations thereof. In some embodiments, widths of vias 118 of guard ring 140 increase along height $H_a$ of TSV 130 (i.e., widths of vias 118 of guard ring 140 increase from side 104 of device substrate 102 to contact 122). For example, width $W_2$ of vias 118 of guard ring 140 increases from a first width to a second width along height $H_a$. In such embodiments, width $W_2$ of via 118 of a interconnect structure may be equal to the first width, width $W_2$ of via 118 of (a+b) interconnect structure may be equal to the second width, and width $W_2$ of via 118 of intermediate interconnect structures may be between the first width and the second width. In some embodiments, widths of vias 118 of guard ring 140 decreases along height $H_a$ of TSV 130 (i.e., widths of vias 118 of guard ring 140 decrease from side 104 of device substrate 102 to contact 122). In some embodiments, vias 118 of interconnect structures of a same set of guard ring 140 have the same width, but the sets have different widths and interconnect structures of guard ring 140 are vertically oriented to provide vertical alignment of TSV-facing sidewalls of vias 118 of the sets. For example, width $W_2$ of vias 118 of set 140a may be equal to a first width and width $W_2$ of vias 118 of set 140b may be equal to a second width, where the first width and the second width are different. In some embodiments, the first width is greater than the second width. In some embodiments, the first width is less than the second width. In some embodiments, vias 118 of interconnect structures of a same set of guard ring 140 have different widths, and sidewalls of vias 118 of the set forming inner sidewall 142 are substantially vertically aligned. For example, width $W_2$ of vias 118 of set 140a are different but TSV-facing sidewalls of vias 118 of set 140a are vertically aligned.

In some embodiments, metal lines 116 of guard ring 140 have the same thickness. In some embodiments, metal lines 116 of guard ring 140 have different thicknesses (e.g., different thicknesses $t_1$). In some embodiments, vias 118 of guard ring 140 have the same thickness. In some embodiments, vias 118 of guard ring 140 have different thicknesses (e.g., different thicknesses $t_2$). In some embodiments, thicknesses of metal lines 116 can vary as described above with references widths of metal lines 116 (e.g., increase or decrease along height $H_a$, vary based on a set to which metal lines 116 belong, etc.). In some embodiments, thicknesses of vias 118 can vary as described above with references to widths of vias 118 (e.g., increase or decrease along height $H_a$, vary based on a set to which vias 118 belong, etc.).

In some embodiments, widths and/or thicknesses of metal lines 116 of guard ring 140 are different than widths and/or thicknesses, respectively, of metal lines 116 of the interconnect layers of MLI feature 110. In some embodiments, widths and/or thicknesses of vias 118 of guard ring 140 are different than widths and/or thicknesses, respectively, of vias 118 of the interconnect layers of MLI feature 110. In some embodiments, widths and/or thicknesses of metal lines 116 of guard ring 140 are the same as widths and/or thicknesses, respectively, of metal lines 116 of the interconnect layers of MLI feature 110. In some embodiments, widths and/or thicknesses of vias 118 of guard ring 140 are the same as widths and/or thicknesses, respectively, of vias 118 of the interconnect layers of MLI feature 110. In some embodiments, conductive materials of metal lines 116 and/or vias 118 of guard ring 140 are different than conductive materials of metal lines 116 and/or vias 118, respectively, of the interconnect layers of MLI feature 110. In some embodiments, conductive materials of metal lines 116 and/or vias 118 of guard ring 140 are the same as conductive materials of metal lines 116 and/or vias 118, respectively, of the interconnect layers of MLI feature 110. In some embodiments, metal lines 116 and vias 118 include copper (e.g., copper plugs), guard ring 140 is a copper ring.

Semiconductor structure 100 may be attached (bonded) to another semiconductor structure to form an IC package or portion thereof. For example, in FIG. 6, semiconductor structure 100 is attached to a semiconductor structure 180, which may be similar to semiconductor structure 100. For example, semiconductor structure 180 includes a respective device substrate 102, a respective MLI feature 110 (having a respective dielectric layer 115, respective metal lines 116, and respective vias 118) disposed over side 104 of the respective device substrate 102, and a respective TC layer (having respective contacts 122) disposed over the respective MLI feature 110. In such embodiments, side 106 (e.g., backside) of device substrate 102 of semiconductor structure 100 is attached to dielectric layer 115 of semiconductor structure 180, and TSV 130 of semiconductor structure 100 is connected to a respective contact 122 of TC layer of semiconductor structure 180. TSV 130 electrically and/or physically connects semiconductor structure 100 and semiconductor structure 180. In some embodiments, TSV 130 extends through a portion of dielectric layer 115 of semiconductor structure 180 to contact 122 of TC layer of semiconductor structure 180. Semiconductor structure 100 and semiconductor structure 180 may be attached by dielectric-to-dielectric bonding (e.g., oxide-to-oxide bonding), metal-to-metal bonding (e.g., copper-to-copper bonding), metal-to-dielectric bonding (e.g., copper-to-oxide bonding), other type of bonding, or combinations thereof.

In some embodiments, semiconductor structure 100 and semiconductor structure 180 are chips that include at least one functional IC, such as an IC configured to perform a logic function, a memory function, a digital function, an analog function, a mixed signal function, a radio frequency (RF) function, an input/output (I/O) function, a communications function, a power management function, other function, or combinations thereof. In such embodiments, TSV 130 physically and/or electrically connects chips. In some embodiments, semiconductor structure 100 and semiconductor structure 180 are chips having the same function (e.g., central processing unit (CPU), graphic processing unit (GPU), or memory). In some embodiments, semiconductor structure 100 and semiconductor structure 180 are chips having different functions (e.g., CPU and GPU, respectively). In some embodiments, semiconductor structure 100 and semiconductor structure 180 are system-on-chips (SoCs). In such embodiments, TSV 130 physically and/or electrically connects SoCs. SoC generally refers to a single chip or monolithic die having multiple functions (e.g., CPU, GPU, memory, other functions, or combinations thereof). In some embodiments, the SoC is a single chip having an entire system, such as a computer system, fabricated thereon. In some embodiments, semiconductor structure 100 is a chip and semiconductor structure 180 is an SoC, or vice versa. In such embodiments, TSV 130 physically and/or electrically connects a chip and an SoC.

In some embodiments, semiconductor structure 100 is a portion of a chip-on-wafer-on-substrate (CoWoS) package, an integrated-fan-out (InFO) package, a system on integrated chip (SoIC) package, other three-dimensional integrated circuit (3DIC) package, or a hybrid package that implements a combination of multichip packaging technologies. In some embodiments, TSV 130 of semiconductor structure 100 is physically and/or electrically connected to a package substrate, an interposer, a redistribution layer (RDL), a printed circuit board (PCB), a printed wiring board, other packaging structure and/or substrate, or combinations thereof. In some embodiments, TSV 130 of semiconductor structure 100 is physically and/or electrically connected to controlled collapse chip connections (C4 bonds) (e.g., solder bumps and/or solder balls) and/or microbumps (also referred to as microbonds, μthumps, and/or μbonds), which are physically and/or electrically connected to a packaging structure.

FIGS. 7A-7I are fragmentary cross-sectional views of a workpiece 200, in portion or entirety, at various fabrication stages of forming a guard ring and a TSV according to various aspects of the present disclosure. FIGS. 8A-8E are fragmentary cross-sectional views of a portion of workpiece 200 at various fabrication stages of forming a TSV trench, which can be implemented at the fabrication stage associated with FIG. 7E, according to various aspects of the present disclosure. For ease of description and understanding, the following discussion of FIGS. 7A-7I and FIGS. 8A-8E is directed to fabricating semiconductor structure 100 of FIG. 1, which includes TSV 130 and guard ring 140. However, the present disclosure contemplates embodiments where processing associated with FIGS. 7A-7I and/or FIGS. 8A-8E are implemented to fabricate workpieces having different configurations of TSV 130 and/or guard ring 140, such as those described herein. FIGS. 7A-7I and FIGS. 8A-8E have been simplified for the sake of clarity to better understand the inventive concepts of the present disclosure. Additional features can be added in workpiece 200, and some of the features described below can be replaced, modified, or eliminated in other embodiments of workpiece 200.

Figure 7A:
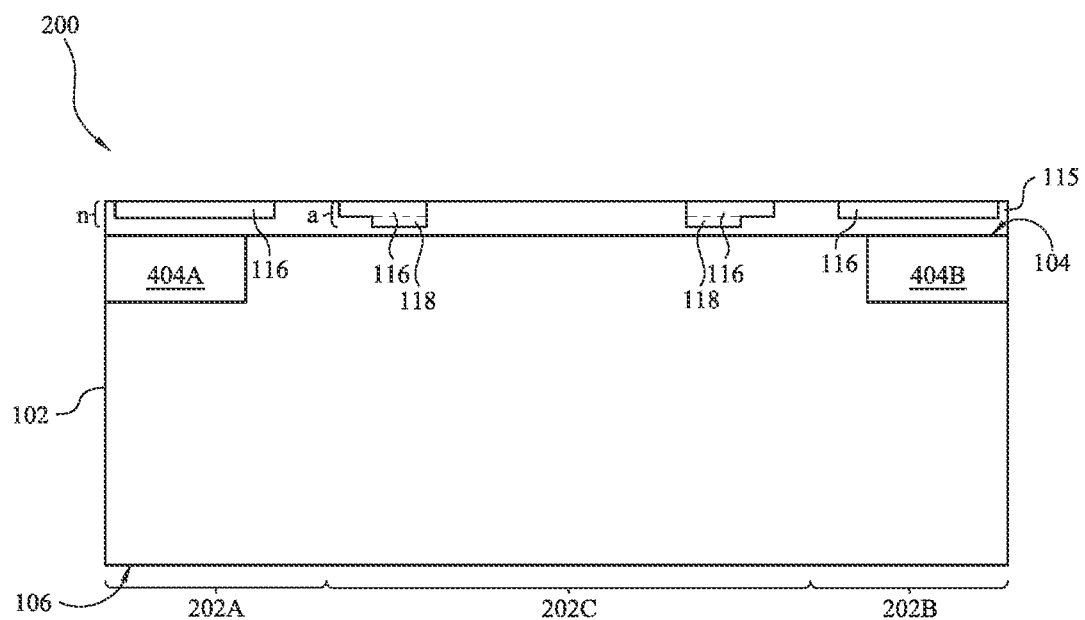
FIGS. 7A-7I are fragmentary cross-sectional views of a workpiece, in portion or entirety, at various fabrication stages of forming a TSV and a corresponding guard ring according to various aspects of the present disclosure.
Figure 7B:
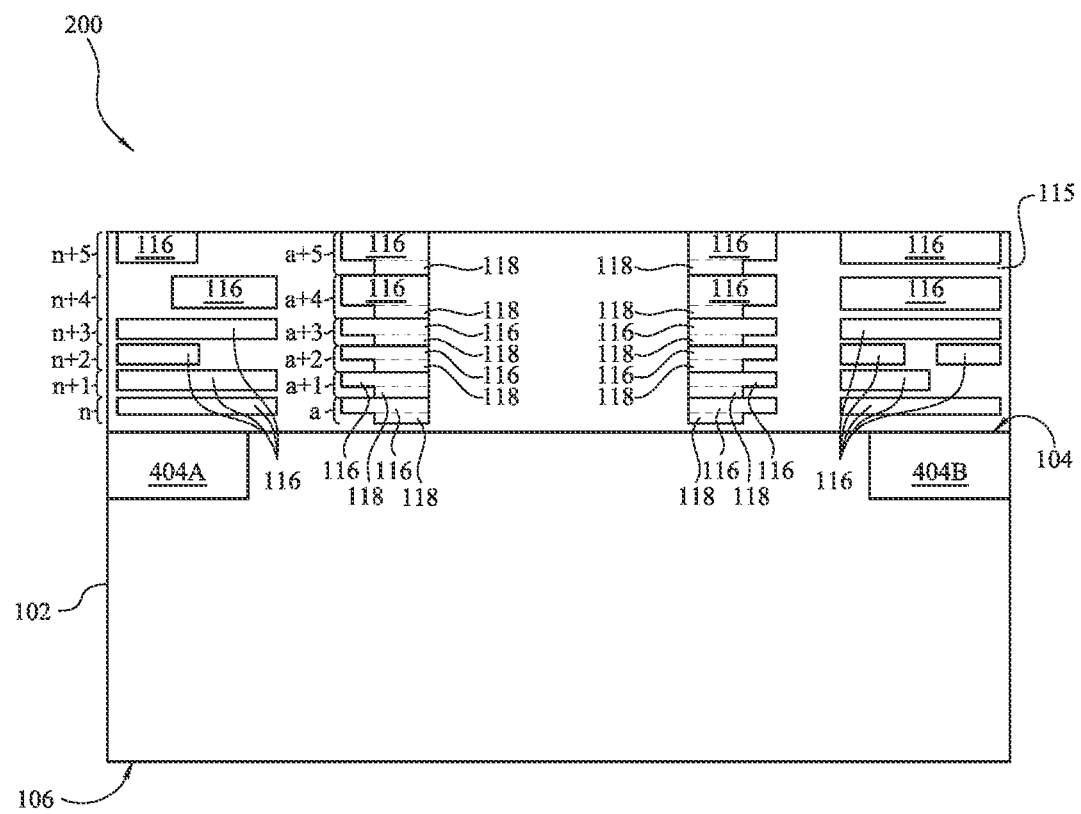
Figure 7C:
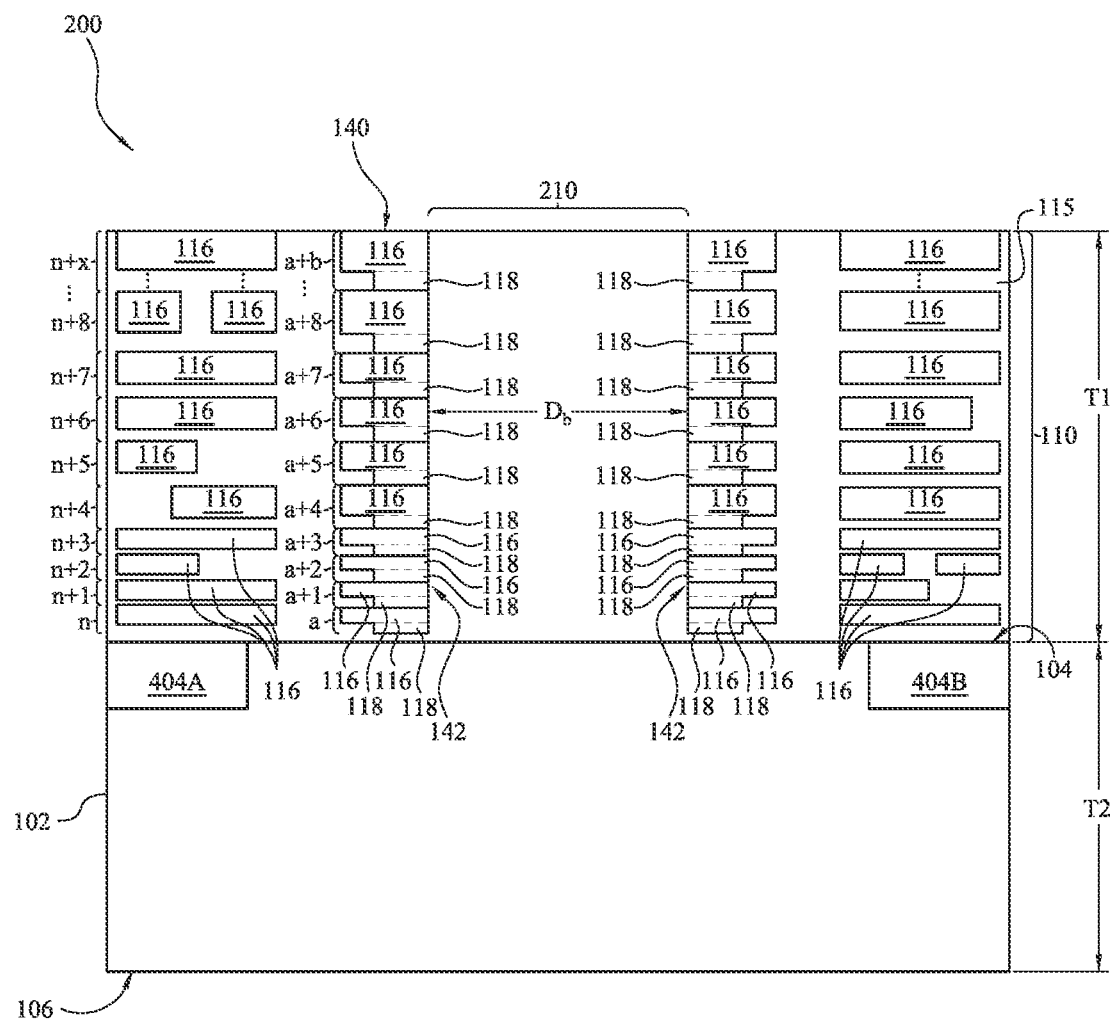

Turning to FIGS. 7A-7C, after workpiece 200 has undergone FEOL processing and MEOL processing, workpiece 200 undergoes BEOL processing to form MLI feature 110 over a device region 202A and/or a device region 202B of device substrate 102. MLI feature 110 may be physically and/or electrically connected to a device, such as a transistor, formed in device region 202A and/or device region 202B. In FIGS. 7A-7C, thicknesses of portions of dielectric layer 115, thicknesses of interconnect layers of MLI feature 110, thicknesses of metal lines 116, thicknesses of vias 118, or combinations thereof are controlled to provide dielectric layer 115 and/or MLI feature 110 with a thickness T1 that is less than a thickness T2 of device substrate 102. To optimize stress characteristics of workpiece 200, such as described herein, thickness T1 is less than or equal to desired length $H_a$ of TSV 130 in dielectric layer 115, and thickness T2 is greater than or equal to desired length $H_b$ of TSV 130 in device substrate 102.

In FIGS. 7A-7C, guard ring 140 is also formed over an intermediate region 202C of device substrate 102 while forming MLI feature 110. Guard ring 140 may be physically and/or electrically connected to device substrate 102, such as to a doped region, such as an n-well or a p-well, formed therein. Guard ring 140 is a conductive ring (e.g., a metal ring) having an inner dimension $D_b$ that defines a dielectric region 210 of dielectric layer 115. As described further below, TSV 130 is formed to extend through dielectric region 210.

In FIG. 7A, 1st level interconnect layer of MLI feature 110 (i.e., $V_1$ layer and $M_1$ layer) and $1^{st}$ interconnect structure of guard ring 140 (e.g., a interconnect structure) is formed over device substrate 102. For example, a patterned via layer (i.e., vias 118) is formed over device substrate 102 and a patterned metal layer (i.e., metal lines 116) is formed over the patterned via layer. In some embodiments, the patterned via layer is formed by depositing a portion of dielectric layer 115 over an MEOL layer, performing a lithography and etching process to form openings in the portion of the dielectric layer 115 that expose underlying conductive features (e.g., contacts and/or vias of the MEOL layer or device features, such as gates and/or source/drains), filling the openings with a conductive material, and performing a planarization process that removes excess conductive material, where the remaining conductive material that fills the openings provides vias 118. Vias 118 and the portion of dielectric layer 115 may form a substantially planar, common surface after the planarization process. In some embodiments, the patterned metal layer is formed by depositing a portion of dielectric layer 115 over the patterned via layer, performing a lithography and etching process to form openings in the portion of the dielectric layer 115 that expose underlying conductive features (e.g., vias 118 of 1st level interconnect layer and vias of $1^{st}$ interconnect structure), filling the openings with a conductive material, and performing a planarization process that removes excess conductive material, where the remaining conductive material that fills the openings provides metal lines 116. Metal lines 116 and the portion of dielectric layer 115 may form a substantially planar, common surface after the planarization process. In some embodiments, vias 118 and metal lines 116 are formed by respective single damascene processes (i.e., vias 118 are formed separately from their corresponding overlying and/or underlying metal lines 116).

In some embodiments, depositing the portion of dielectric layer 115 includes depositing an ILD layer. In some embodiments, depositing the portion of dielectric layer 115 includes depositing a CESL. Dielectric layer 115, CESL, ILD layer, or combinations thereof are formed by chemical vapor deposition (CVD), plasma enhanced CVD (PECVD), high density plasma CVD (HDPCVD), flowable CVD (FCVD), physical vapor deposition (PVD), atomic layer deposition (ALD), metalorganic chemical vapor deposition (MOCVD), remote plasma CVD (RPCVD), low-pressure CVD (LPCVD), atomic layer CVD (ALCVD), atmospheric pressure CVD (APCVD), other suitable deposition methods, or combinations thereof.

In some embodiments, $1^{st}$ level interconnect layer of MLI feature 110 and/or $1^{st}$ interconnect structure of guard ring 140 are formed by a dual damascene process, which can involve depositing conductive material for via/metal line pairs at the same time. In such embodiments, vias 118 and metal lines 116 may share a barrier layer and a conductive plug, instead of each having a respective and distinct barrier layer and conductive plug (e.g., where a barrier layer of a respective metal line 116 separates a conductive plug of the respective metal line 116 from a conductive plug of its corresponding, respective via 118). In some embodiments, the dual damascene process includes performing a patterning process to form interconnect openings that extend through dielectric layer 115 to expose underlying conductive features. The patterning process can include a first lithography step and a first etch step to form trench openings of the interconnect openings (which correspond with and define metal lines 116) in dielectric layer 115 and a second lithography step and a second etch step to form via openings of the interconnect openings (which correspond with and define vias 118) in dielectric layer 115. The first lithography/first etch step and the second lithography/second etch step can be performed in any order (e.g., trench first via last or via first trench last). The first etch step and the second etch step are each configured to selectively remove dielectric layer 115 with respect to a patterned mask layer. The first etch step and the second etch step may be a dry etching process, a wet etching process, other suitable etching process, or combinations thereof.

After performing the patterning process, the dual damascene process can include performing a first deposition process to form a barrier material over dielectric layer 115 that partially fills the interconnect openings and performing a second deposition process to form a bulk conductive material over the barrier material, where the bulk conductive material fills remainders of the interconnect openings. In such embodiments, the barrier material and the bulk conductive material are disposed in the interconnect openings and over a top surface of dielectric layer 115. The first deposition process and the second deposition process can include CVD, PVD, ALD, HDPCVD, MOCVD, RPCVD, PECVD, LPCVD, ALCVD, APCVD, PEALD, electroplating, electroless plating, other suitable deposition methods, or combinations thereof. A CMP process and/or other planarization process is then performed to remove excess bulk conductive material and barrier material from over the top surface of dielectric layer 115, resulting in the patterned via layer (e.g., vias 118) and the patterned metal layer (e.g., metal lines 116) of $1^{st}$ level interconnect layer of MLI feature 110 and corresponding $1^{st}$ interconnect structure of guard ring 140. The CMP process planarizes top surfaces of dielectric layer 115 and vias 118 and/or metal lines 116. The barrier material and the bulk conductive material may fill the trench openings and the via openings of the interconnect openings without interruption, such that barrier layers and conductive plugs of metal lines 116 and vias 118 may each extend continuously from metal lines 116 to respective vias 118 without interruption.

In FIG. 7B, $2^{nd}$ level interconnect layer through $6^{th}$ level interconnect layer of MLI feature 110 (i.e., (n+1) level interconnect layer through (n+5) level interconnect layer) are formed over $1^{st}$ level interconnect layer. $2^{nd}$ interconnect structure through $6^{th}$ interconnect structure of guard ring 140 (i.e., (a+1) interconnect structure through (a+5) interconnect structure) are formed while forming $2^{nd}$ level interconnect layer through $6^{th}$ level interconnect layer, respectively. Each of $2^{nd}$ level interconnect layer through $6^{th}$ level interconnect layer of MLI feature 110, and $2^{nd}$ interconnect structure through $6^{th}$ interconnect structure of guard ring 140 corresponding therewith, may be formed as described above with reference to fabrication of $1^{st}$ level interconnect layer of MLI feature 110 and $1^{st}$ interconnect structure of guard ring 140.

In FIG. 7C, $7^{th}$ level interconnect layer through $10^{th}$ level interconnect layer of MLI feature 110 (i.e., (n+6) level interconnect layer through (n+x) level interconnect layer) are formed over $6^{th}$ level interconnect layer. $7^{th}$ interconnect structure through $10^{th}$ interconnect structure of guard ring 140 (i.e., (a+6) interconnect structure through (a+b) interconnect structure) are formed while forming $7^{th}$ level interconnect layer through $10^{th}$ level interconnect layer, respectively. Each of $7^{th}$ level interconnect layer through $10^{11}$ level interconnect layer of MLI feature 110, and $7^{th}$ interconnect structure through $10^{th}$ interconnect structure of guard ring 140 corresponding therewith, may be formed as described above with reference to fabrication of 1st level interconnect layer of MLI feature 110 and 1st interconnect structure of guard ring 140.

In some embodiments, for a given level interconnect layer, metal lines 116 and vias 118 of an interconnect structure of guard ring 140 at the given level interconnect layer are formed simultaneously with metal lines 116 and vias 118, respectively, of the given level interconnect layer. In some embodiments, for a given level interconnect layer, metal lines 116 and vias 118 of an interconnect structure of guard ring 140 at the given level interconnect layer are formed at least partially simultaneously with metal lines 116 and vias 118, respectively, of the given level interconnect layer. In some embodiments, for a given level interconnect layer, metal lines 116 and vias 118 of an interconnect structure of guard ring 140 at the given level interconnect layer are formed by different processes than metal lines 116 and vias 118, respectively, of the given level interconnect layer. In some embodiments, for a given level interconnect layer, metal lines 116 and/or vias 118 of an interconnect structure of guard ring 140 at the given level interconnect layer and metal lines 116 and/or vias 118, respectively, of the given level interconnect layer are formed by the same single damascene process. In some embodiments, for a given level interconnect layer, metal lines 116 and/or vias 118 of an interconnect structure of guard ring 140 at the given level interconnect layer and metal lines 116 and/or vias 118, respectively, of the given level interconnect layer are formed by different single damascene processes. In some embodiments, for a given level interconnect layer, metal lines 116 and vias 118 of an interconnect structure of guard ring 140 at the given level interconnect layer and metal lines 116 and vias 118 of the given level interconnect layer are formed by the same dual damascene process. In some embodiments, for a given level interconnect layer, metal lines 116 and vias 118 of an interconnect structure of guard ring 140 at the given level interconnect layer and metal lines 116 and vias 118 of the given level interconnect layer are formed by different dual damascene processes.

Figure 7D:
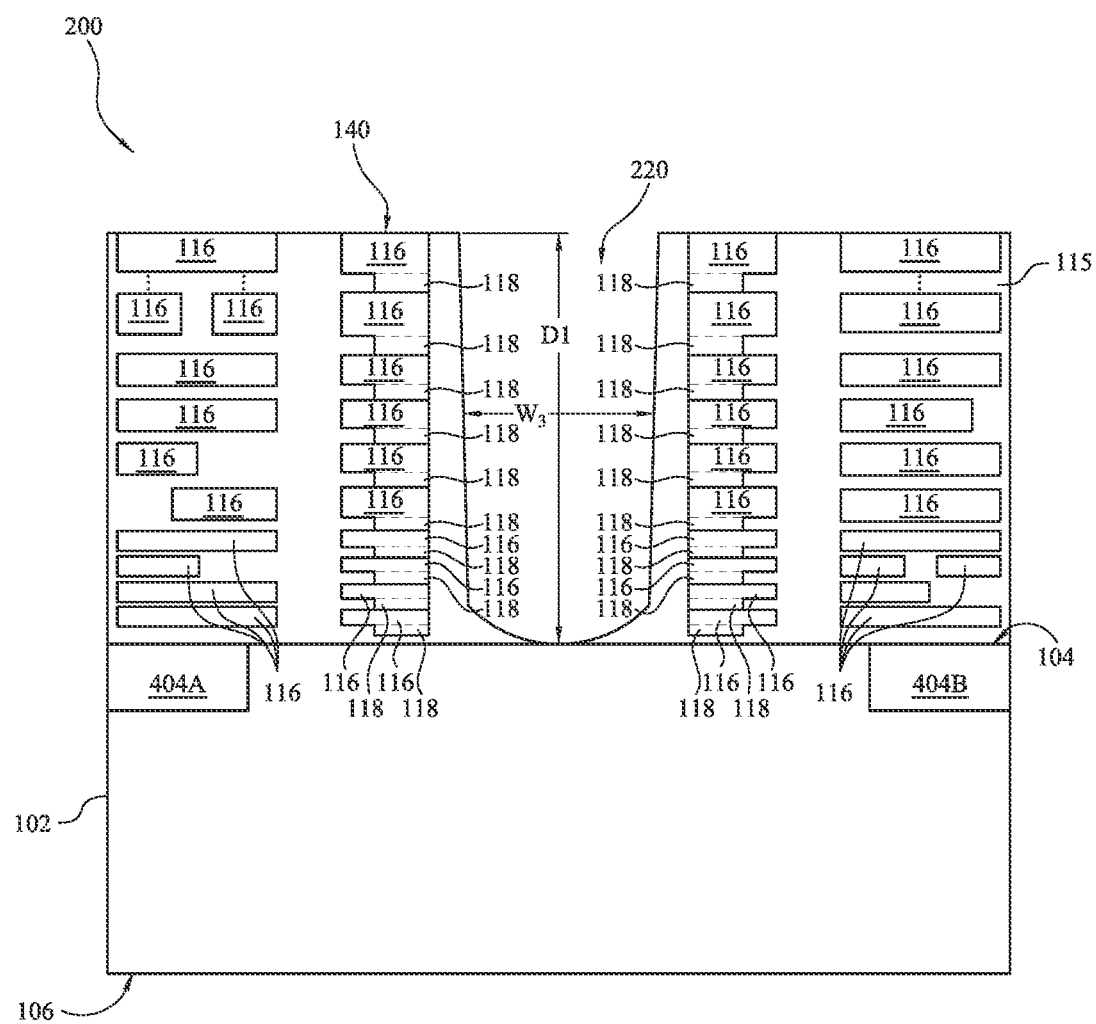

In FIG. 7D, a trench 220 is formed in dielectric region 210 of dielectric layer 115. Trench 220 extends through dielectric layer 115 to expose side 104 of device substrate 102. Trench 220 has a depth D1 along the z-direction and a width $W_3$ along the x-direction. Depth D1 is equal to thickness T1 of dielectric layer 115, and depth D1 is less than or equal to desired length $H_a$ of TSV 130 in dielectric layer 115. Width $W_3$ is less than inner dimension $D_b$ of guard ring 140. In some embodiments, width $W_3$ is equal to dimension $D_{TSV}$. In some embodiments, forming trench 220 includes forming a patterned mask layer having an opening therein that exposes dielectric region 210 of dielectric layer 115 and etching dielectric layer 115 using the patterned mask layer as an etch mask. A width of the opening of the patterned mask layer can be configured to provide a desired spacing between guard ring 140 and subsequently formed TSV 130, a desired width $D_{TSV}$ of subsequently formed TSV 130, a desired ratio of width $D_{TSV}$ to length $H_a$, or combinations thereof. For example, the opening in the patterned mask layer is provided with a width that is about equal to a desired width and/or a desired diameter of TSV 130. In some embodiments, a ratio of a width of the opening in the patterned mask layer (and/or width $W_3$) to depth D1 is substantially the same as a ratio of width $D_{TSV}$ to length $H_a$. Controlling spacing between guard ring 140 and trench 220 and/or the ratio of the width of the opening in the patterned mask layer (and/or width $W_3$) to depth D1 can reduce etching-induced defects and/or enhance etching process control. The patterned mask layer may be formed using a lithography process, which can include resist coating (for example, spin-on coating), soft baking, mask aligning, exposure, post-exposure baking, developing the resist, rinsing, drying (for example, hard baking), other suitable process, or combinations thereof. In some embodiments, the patterned mask layer is a patterned hard mask layer (e.g., a silicon nitride layer). In some embodiments, the patterned mask layer is a patterned resist layer. The etching may be a dry etching process, a wet etching process, other etching process, or combinations thereof.

Figure 7E:
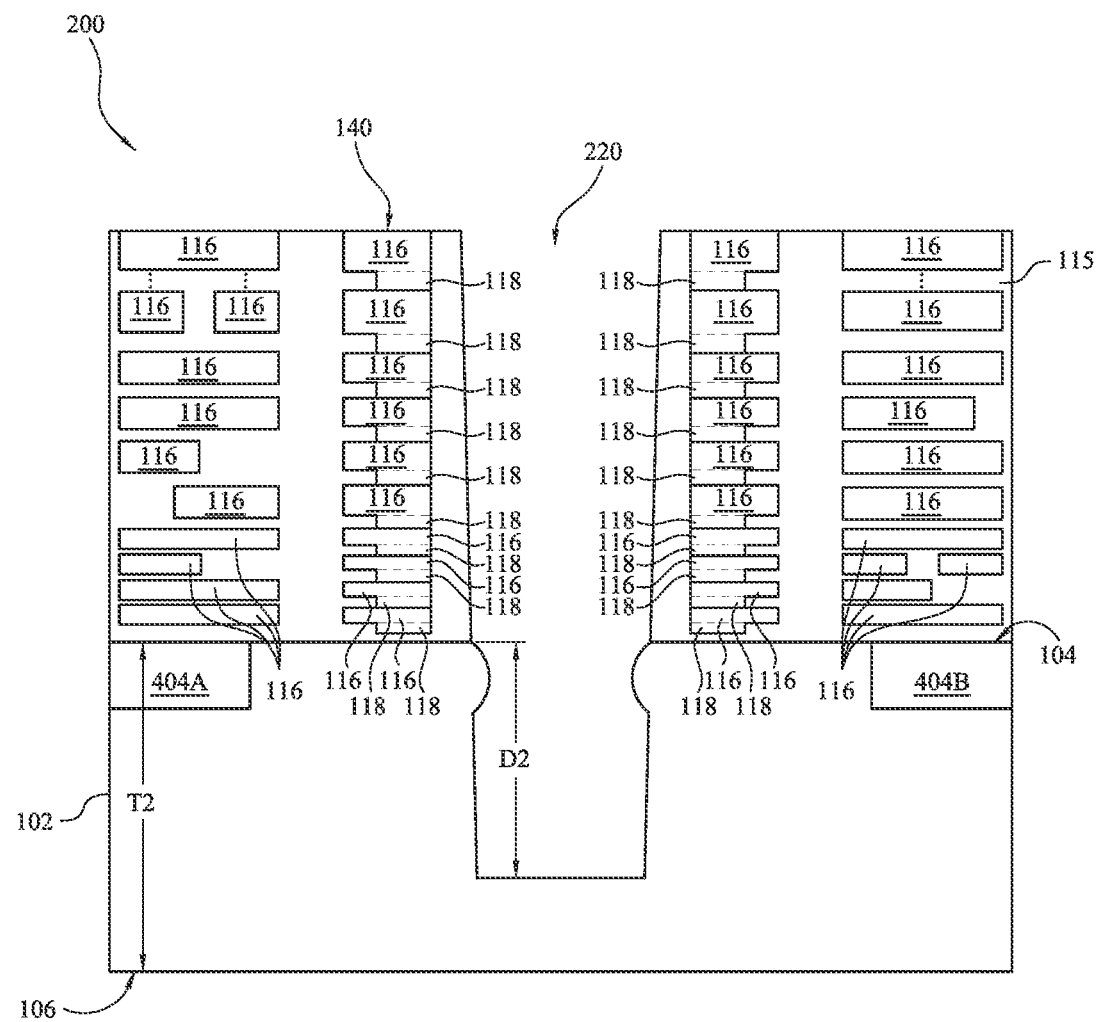
Figure 7F:
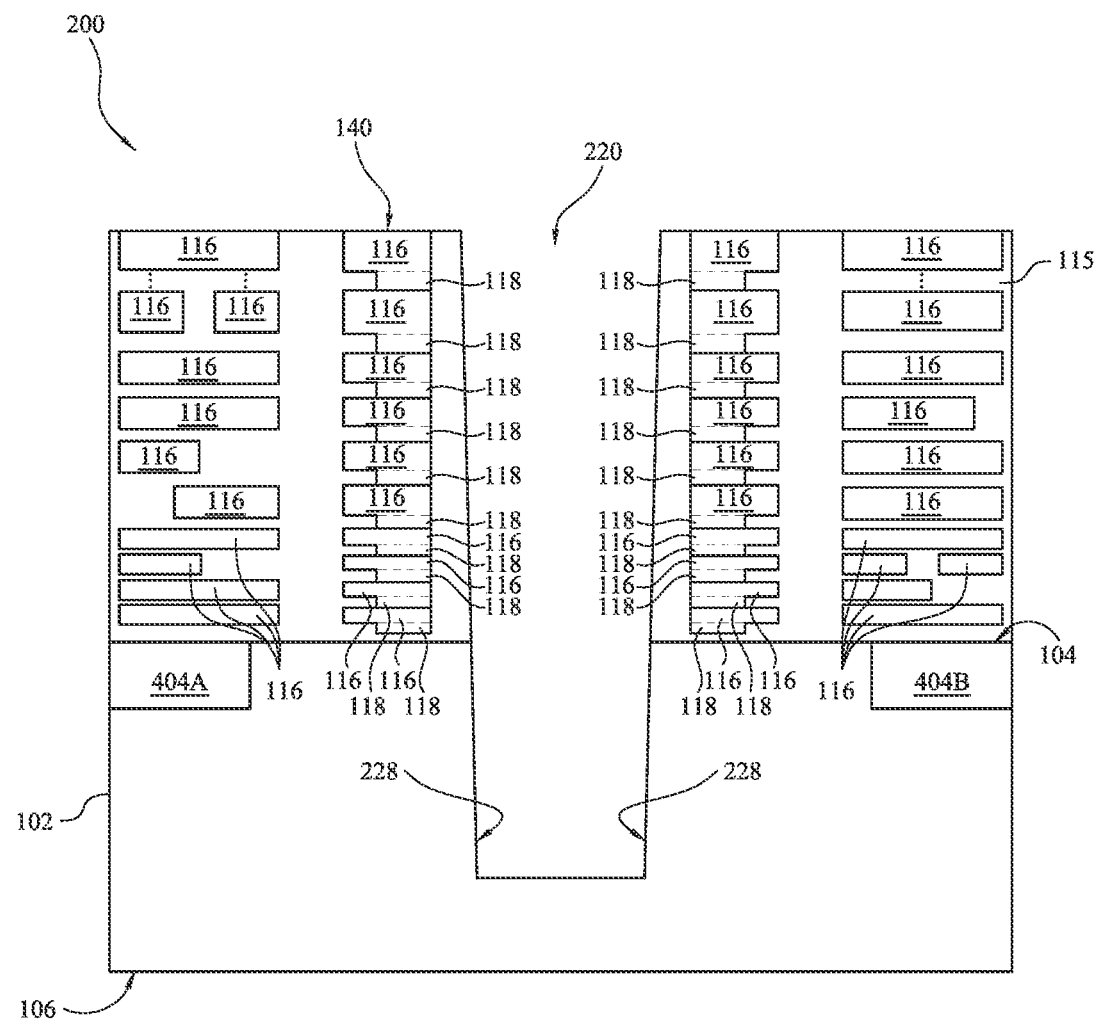

In FIG. 7E, trench 220 is extended into device substrate 102 by a suitable process, such as an etching process. The etching process is a dry etching process, a wet etching process, other etching process, or combinations thereof. In some embodiments, the etching process is an isotropic dry etch (i.e., an etching process that removes material in more than one direction, such as vertically along the z-direction and laterally along the x-direction). In FIG. 7E, trench 220 extends a depth D2 into device substrate 102. Depth D2 is less than thickness T2 of device substrate 102. In some embodiments, depth D2 is equal to desired length $H_b$ of TSV 130 in device substrate 102, such as embodiments where a subsequent grinding process and/or planarization process on side 106 of device substrate 102 stops upon reaching TSV 130. In some embodiments, depth D2 is greater than desired length $H_b$ of TSV 130 in device substrate 102, such as embodiments where a subsequent grinding process and/or planarization process on side 106 of device substrate 102 removes a portion of TSV 130. In some embodiments, such as where a subsequent grinding process and/or planarization process is omitted, depth D2 equals thickness T2, which equals desired length $H_b$ of TSV 130 in device substrate 102, and trench 220 extends entirely through device substrate 102 (i.e., from side 104 to side 106).

In some embodiments, a Bosch process, such as depicted in FIGS. 8A-8E, is implemented to extend trench 220 into device substrate 102. A Bosch process generally refers to a high-aspect ratio plasma etching process that involves alternating etch phases and deposition phases, where a cycle includes an etch phase and a deposition phase and the cycle is repeated until trench 220 has desired depth D2. For example, the Bosch process can include introducing a first gas (e.g., a fluorine-containing gas, such as $SF_6$) into a process chamber to etch device substrate 102 (e.g., silicon) and extend trench 220 to a depth d1 in device substrate 102 that is less than depth D2 (FIG. 8A, an etch phase); stopping the first gas and introducing a second gas (e.g., a fluorine-containing gas, such as $C_4F_8$) into the process chamber to form a protective layer 224 over surfaces of device substrate 102 that form trench 220 (FIG. 8B, a deposition phase); stopping the second gas and introducing the first gas into the process chamber to further etch device substrate 102 and extend trench 220 to a depth d2 in device substrate 102 that is less than depth D2 (FIG. 8C, an etch phase); stopping the first gas and introducing the second gas into the process chamber to form protective layer 224 (also referred to as a polymer layer or a passivation layer) over exposed surfaces of device substrate 102 that form trench 220 (FIG. 8D, a deposition phase); and repeating cycles of the Bosch process (i.e., etch phase plus polymer deposition phase) until trench 220 extends to depth D2 in device substrate 102 (FIG. 8E). Each etch phase may remove portions of protective layer 224 that cover surfaces of device substrate 102 that form a bottom of trench 220, but not portions of protective layer 224 that cover surfaces of device substrate 102 that form sidewalls of trench 220. Protective layer 224 can include fluorine and carbon (i.e., a fluorocarbon-based layer). The Bosch process can use a patterned mask layer 222 as an etch mask. In some embodiments, patterned mask layer 222 was formed and used as an etch mask when forming trench 220 in dielectric layer 115 in FIG. 7D.

In FIG. 8E, because the Bosch process laterally etches (as well as vertically etches) device substrate 102 during each etch phase, trench 220 has scalloped sidewalls, wavy sidewalls, rough sidewalls, or combinations thereof in device substrate 102, which are formed by curvilinear segments 226. Rough sidewalls can negatively impact subsequently formed TSV 130. For example, TSV 130 may delaminate from scalloped sidewalls and/or rough sidewalls of device substrate 102. Accordingly, in FIG. 7F, a smoothing process is performed on sidewalls of trench 220. Parameters of the smoothing process are tuned to remove scalloped sidewalls, wavy sidewalls, rough sidewalls, or combinations thereof of trench 220 in device substrate 102. For example, trench 220 has substantially linear sidewalls and/or substantially flat sidewalls 228 after the smoothing process. In some embodiments, the smoothing process is an etching process that selectively removes a semiconductor material (e.g., silicon portions of device substrate 102) with minimal (to no) removal of a dielectric material (e.g., dielectric layer 115). The etching process is a dry etching process, a wet etching process, other etching process, or combinations thereof. In some embodiments, the smoothing process also removes protective layer 224 from trench 220. In some embodiments, the smoothing process is not performed, but a suitable process, such as an etching process and/or a cleaning process, is performed to remove protective layer 224 before forming TSV 130 in trench 220. In some embodiments, separate processes are used to smooth sidewalls of trench 220 and remove protective layer 224, such as a first etching process configured to remove protective layer 224 and a second etching process to smooth sidewalls of trench 220. In such embodiments, the first etching process and the second etching process have at least one parameter that is different (e.g., etch gas, etch time, etc.).

Figure 7G:
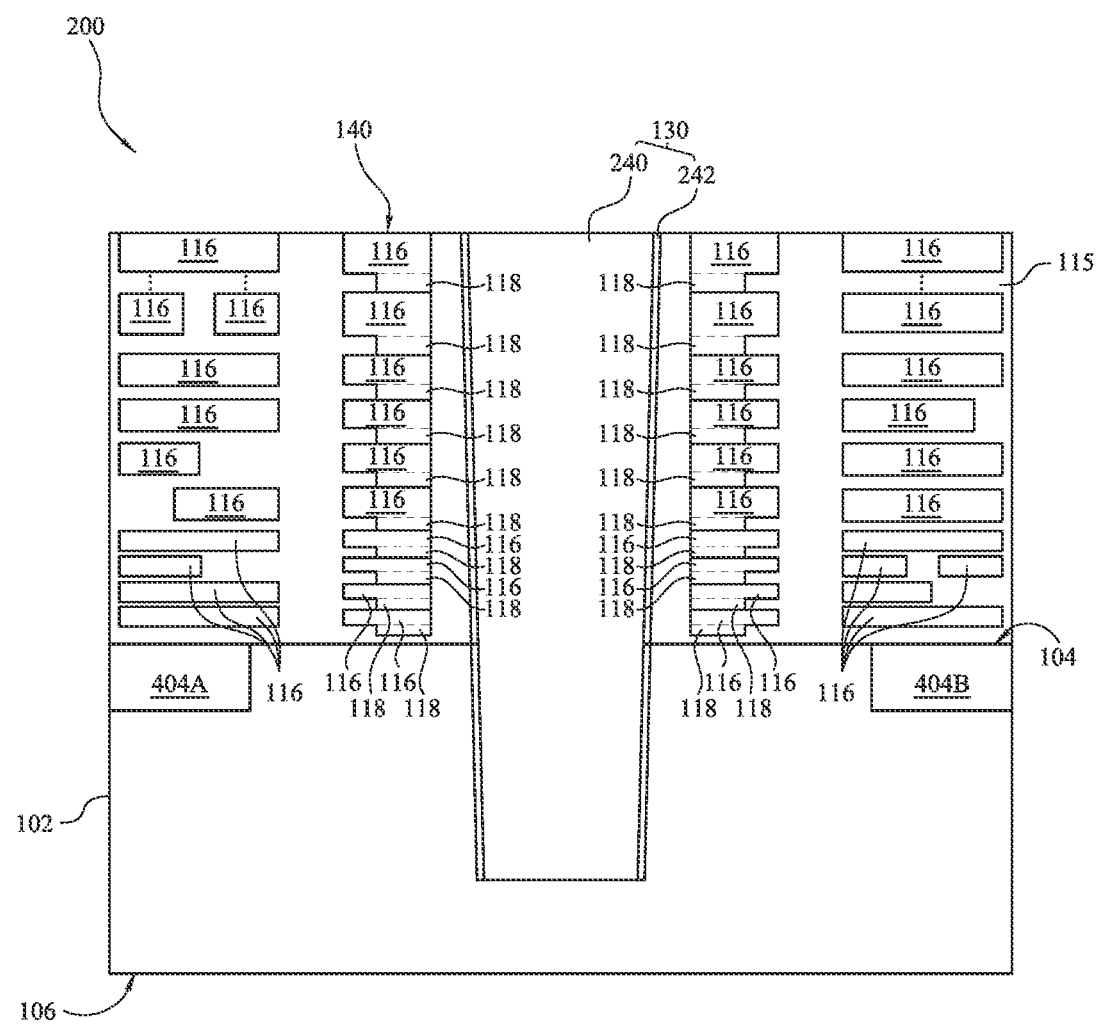

In FIG. 7G, fabrication proceeds with filling trench 220 with TSV 130. TSV 130 extends through dielectric layer 115 and through device substrate 102 to depth D. TSV 130 includes a conductive plug 240 disposed over a barrier layer 242. In some embodiments, TSV 130 is formed by depositing a barrier material (e.g., TiN or TaN) over workpiece 200 that partially fills trench 220, depositing a bulk conductive material (e.g., Cu) over workpiece 200 that fills a remainder of trench 220, and performing a planarization process (e.g., CMP) to remove excess barrier layer material and excess bulk conductive material from over workpiece 200 (e.g., from over a top surface of dielectric layer 115, top surfaces of metal lines 116 of (n+x) level interconnect layer, and top surfaces of metal lines 116 of (a+b) interconnect structure of guard ring 140). A remainder of barrier material and bulk conductive material, which fills trench 220, form barrier layer 242 and conductive plug 240, respectively.

Figure 7H:
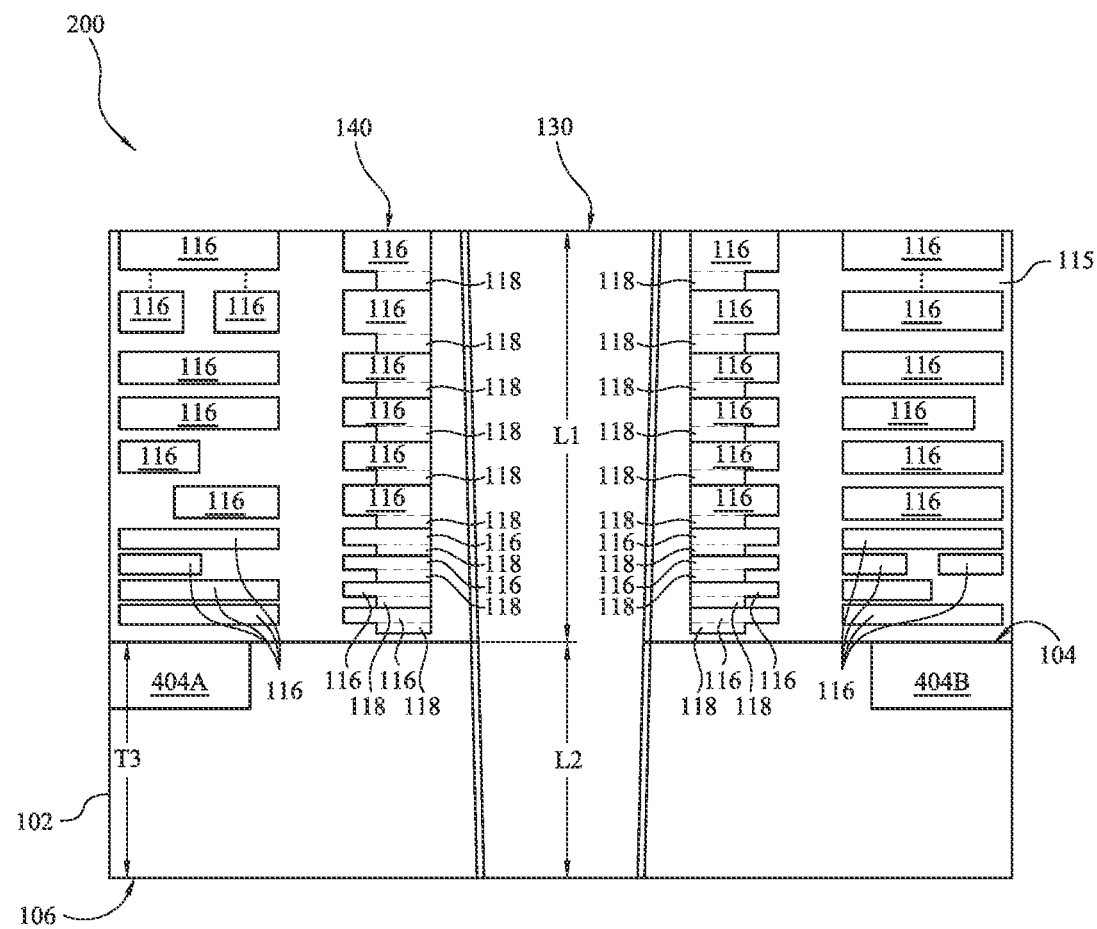

In FIG. 7H, a thinning process is performed to reduce thickness T2 of device substrate 102 to a thickness T3 and expose TSV 130, such that TSV 130 extends entirely through device substrate 102. For example, after the thinning process, TSV 130 has a length L2 in device substrate 102 that is equal to thickness T3, and TSV 130 extends from side 104 (e.g., frontside) to side 106 (e.g., backside) of device substrate 102. Length L2 is equal to desired length $H_b$ of TSV 130 in device substrate 102. Length L1 of TSV 130 is less than or equal to desired length $H_a$ of TSV 130 in dielectric layer 115. In embodiments where depth D2 of trench 220 is greater than desired length $H_b$ of TSV 130 in device substrate 102, the thinning process continues after exposing TSV 130 to reduce a length of TSV 130. In such embodiments, the thinning process is continued for a time sufficient to reduce a length of TSV 130 from a first length (e.g., a length equal to depth D2) to a second length (e.g., length L2 that is equal to desired length $H_b$). The thinning process thus reduces thickness of device substrate 102 and/or length of TSV 130 along the z-direction. The thinning process is a grinding process, a planarization process (e.g., CMP), an etching process, other suitable process, or combinations thereof. The thinning process is applied to side 106 of device substrate 102. In some embodiments, workpiece 200 is attached to a carrier wafer before performing the thinning process. For example, dielectric layer 115 and/or a topmost patterned metal layer (e.g., TC layer) may be bonded to a carrier wafer.

Figure 7I:
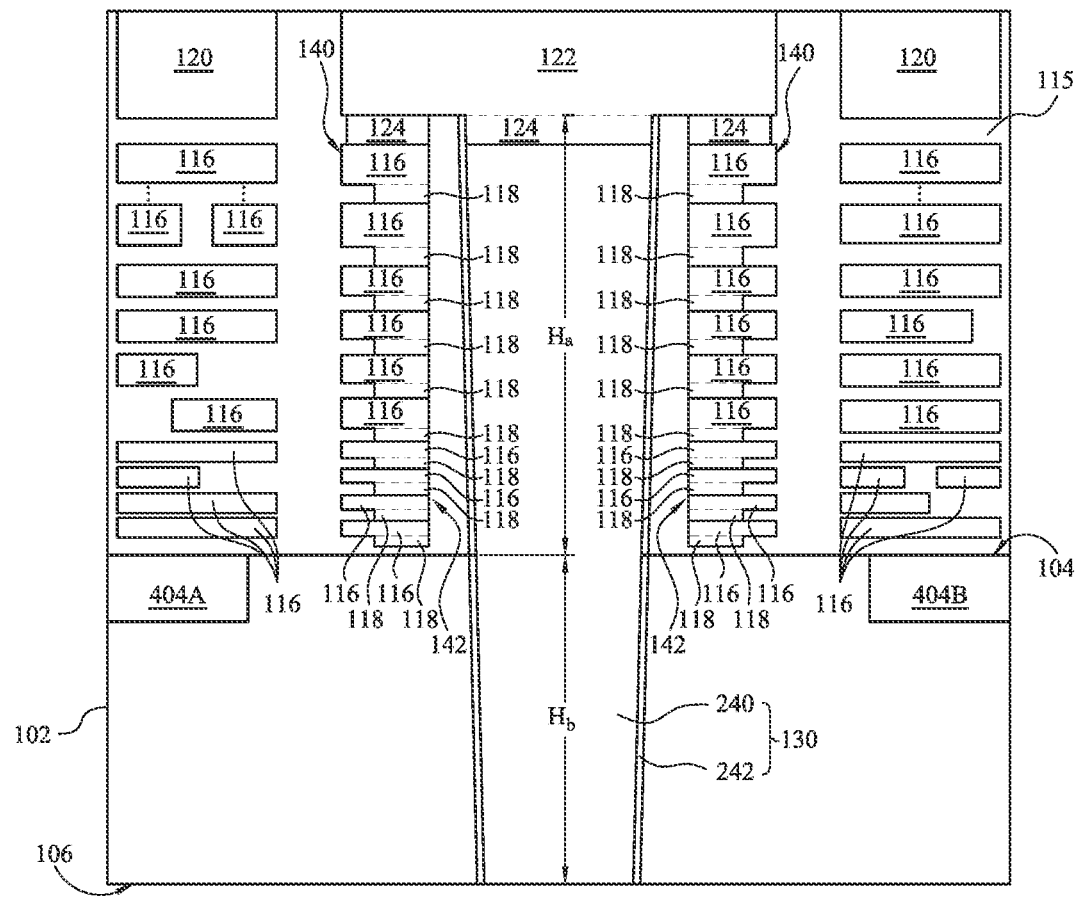

In FIG. 7I, TC layer is formed over MLI feature 110, TSV 130, and guard ring 140. In some embodiments, length $H_a$ is a sum of a thickness of via 124 in TC layer and length L1 of TSV 130 in dielectric layer 115 before forming TC layer. In some embodiments, length $H_a$ does not include a thickness of via 124 in TC layer, and length $H_a$ of TSV 130 in dielectric layer 115 equals length L1 of TSV 130 in dielectric layer 115 before forming TC layer. In some embodiments, forming TC layer includes depositing a passivation layer over workpiece 200 and patterning the passivation layer to have openings therein that expose metal lines 116 of (n+x) level interconnect layer of MLI feature 110, TSV 130, and metal lines 116 of (a+b) interconnect structure of guard ring 140 (i.e., topmost metal features of workpiece 200). One of the openings in the patterned passivation layer may expose TSV 130, guard ring 140, and dielectric layer 115 between TSV 130 and guard ring 140. In some embodiments, forming TC layer further includes depositing conductive material over workpiece 200 that fills the openings in the patterned passivation layer and performing a planarization process that removes excess conductive material from over a top surface of the passivation layer, thereby forming contacts 120, contact 122, and vias 124 in the passivation layer. Depositing the conductive material can include depositing a barrier layer over the patterned passivation layer that partially fills the openings therein and depositing a bulk metal layer over the barrier layer that fills a remainder of the openings. In some embodiments, TC layer is formed before the thinning process.

Figure 9:
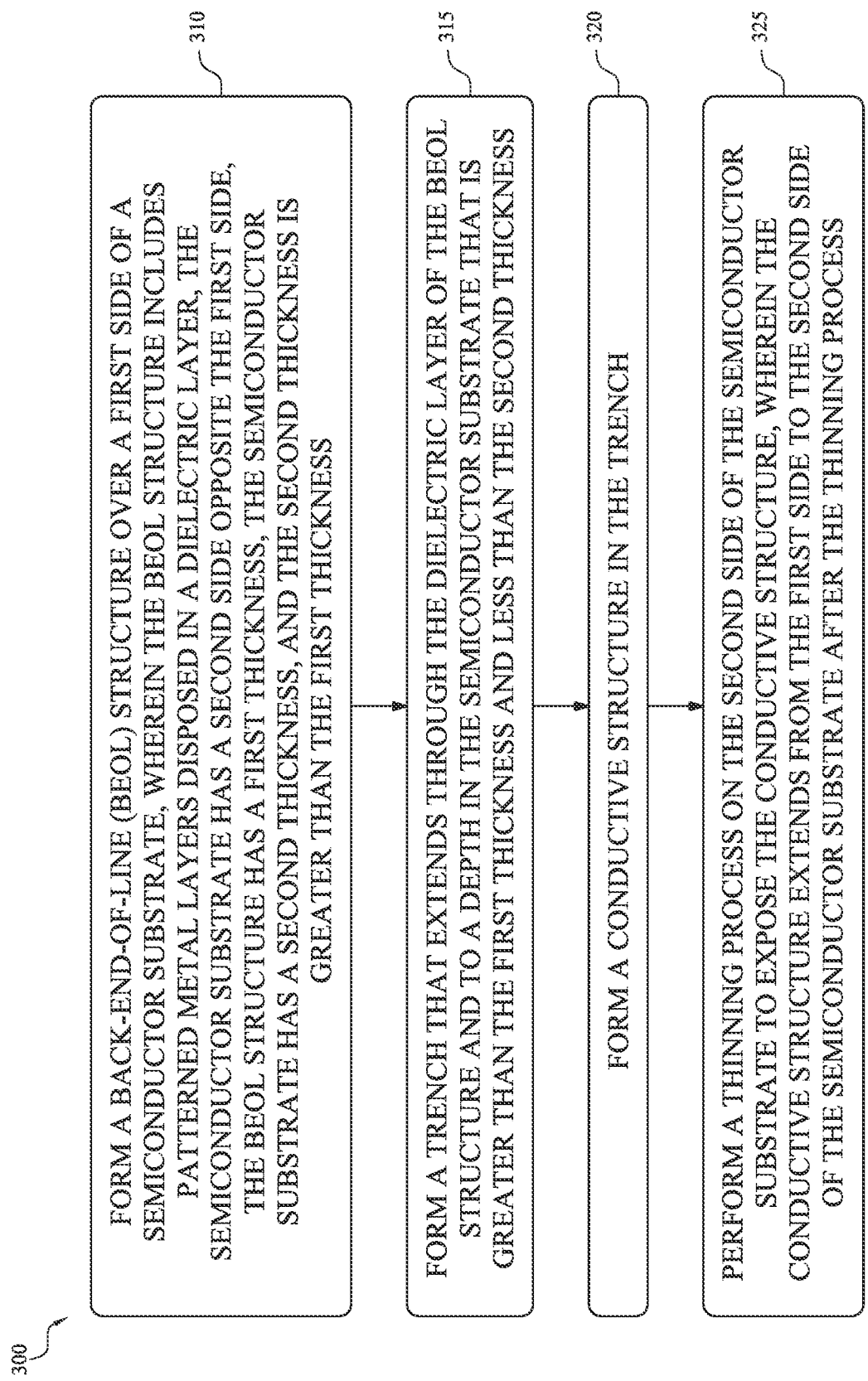
FIG. 9 is a flow chart of a method, in portion or entirety, for fabricating a semiconductor structure, such as the semiconductor structure of FIG. 1 and FIG. 2, according to various aspects of the present disclosure.

FIG. 9 is a flow chart of a method 300 for fabricating a through via, such as TSV 130, according to various aspects of the present disclosure. At block 310, method 300 includes forming a back-end-of-line (BEOL) structure over a first side of a semiconductor substrate. The BEOL structure includes patterned metal layers disposed in a dielectric layer. The semiconductor substrate has a second side opposite the first side. The BEOL structure has a first thickness, the semiconductor substrate has a second thickness, and the second thickness is greater than the first thickness. At block 315, method 300 includes forming a trench that extends through the dielectric layer of the BEOL structure and to a depth in the semiconductor substrate. The depth is greater than the first thickness and less than the second thickness. At block 320, method 300 includes forming a conductive structure in the trench. At block 325, method 300 includes performing a thinning process on the second side of the semiconductor substrate to expose the conductive structure. The conductive structure extends from the first side to the second side of the semiconductor substrate after the thinning process. In some embodiments, method 300 further includes forming a stack of interconnect structures while forming the BEOL structure. The stack of interconnect structures forms a ring that defines a region of the dielectric layer. The trench is formed in and extends through the region of the dielectric layer. In some embodiments, the conductive structure has a first length in the dielectric layer and a second length in the semiconductor substrate. In some embodiments, the first length is less than the second length. In some embodiments, a ratio of the first length to the second length is about 0.25 to about 0.5. In some embodiments, the BEOL structure and the semiconductor substrate form a semiconductor structure, which can be attached (bonded) to another semiconductor structure. For example, the second side of the semiconductor substrate is attached to a second semiconductor structure and the conductive structure electrically and/or physically connects the first semiconductor structure and the second semiconductor structure. FIG. 9 has been simplified for the sake of clarity to better understand the inventive concepts of the present disclosure. Additional steps can be provided before, during, and after method 300, and some of the steps described can be moved, replaced, or eliminated for additional embodiments of method 300.

Figure 10:
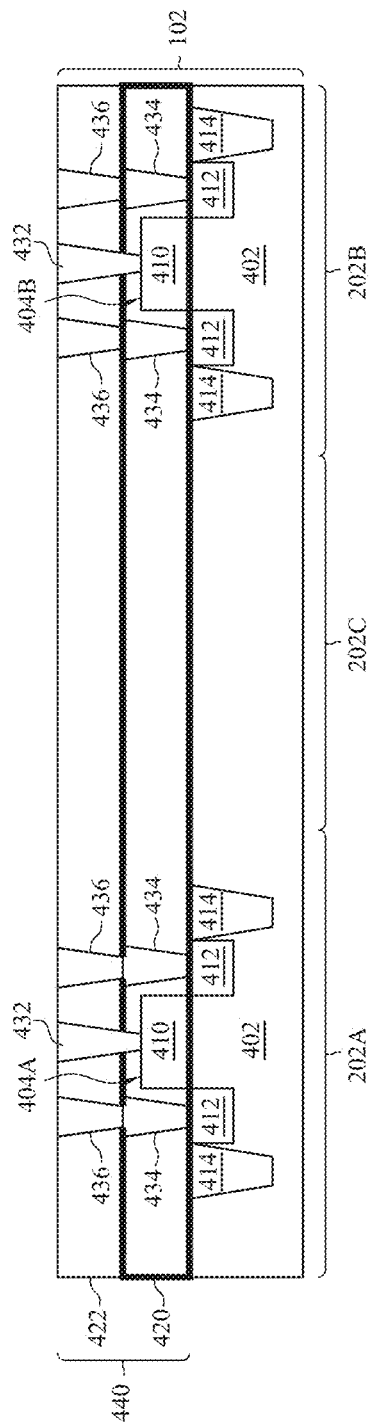
FIG. 10 is a fragmentary diagrammatic cross-sectional view of a device substrate, in portion or entirety, that can be implemented in the semiconductor structure of FIG. 1 and FIG. 2 according to various aspects of the present disclosure.

FIG. 10 is a fragmentary diagrammatic cross-sectional view of device substrate 102, in portion or entirety, according to various aspects of the present disclosure. In FIG. 10, device substrate 102 has device region 202A, device region 202B, and intermediate region 202C. Device substrate 102 includes a semiconductor substrate 402 and various transistors, such as a transistor 404A in device region 202A and a transistor 404B in device region 202B. Transistor 404A and transistor 404B each include a respective gate structure 410 (which can include gate spacers disposed along a gate stack (e.g., a gate electrode disposed over a gate dielectric)) disposed between respective source/drains 412 (e.g., epitaxial source/drains), which are disposed on, in, and/or over semiconductor substrate 402, where a channel extends between respective source/drains 412 in semiconductor substrate 402. Device substrate 102 may further include isolation structures 414, such as shallow trench isolation features, that separate and/or electrically isolate transistors, such as transistor 404A and transistor 404B, and/or other devices of device substrate 102 from one another. Device substrate 102 further includes a dielectric layer 420 and a dielectric layer 422, which are similar to and can be fabricated similar to the dielectric layers described herein (i.e., dielectric layer 420 can include one or more ILD layers and/or one or more CESLs). Gate contacts 432 are disposed in dielectric layer 420 and dielectric layer 422, source/drain contacts 434 are disposed in dielectric layer 420, and vias 436 are disposed in dielectric layer 422. Gate contacts 432 electrically and physically connect gate structures 410 (in particular, gate electrodes) to MLI feature 110, and source/drain contacts 434 and/or vias 436 electrically and physically connect source/drains 412 to MLI feature 110. In some embodiments, dielectric layer 420, dielectric layer 422, gate contacts 432, source/drain contacts 434, and vias 436 form an MEOL layer 440. In some embodiments, gate contacts 432, source/drain contacts 434, vias 436, or combinations thereof are physically and/or electrically connected to n level interconnect layer of MLI feature 110. In some embodiments, gate contacts 432 and/or vias 436 may form a portion of $V_n$ layer of n level interconnect layer, and gate contacts 432 and/or vias 436 are physically and/or electrically connected to $M_n$ layer of n level interconnect layer. In such embodiments, vias 118 of a interconnect structure of guard ring 140 may be disposed in dielectric layer 422. In some embodiments, dielectric layer 420 and/or dielectric layer 422 form a portion of dielectric layer 115. In some embodiments, contacts (not shown) are disposed in dielectric layer 420 over a doped region in semiconductor substrate 402 in intermediate region 202C, and vias (not shown) are disposed in dielectric layer 422 over the contacts. In some embodiments, the contacts and the vias in intermediate region 202c may physically and/or electrically connect the doped region to guard ring 140. In such embodiments, the vias may be vias 118 of a interconnect structure of guard ring 140, and in some embodiments, the vias may be disposed in $V_n$ layer of n level interconnect layer. FIG. 10 has been simplified for the sake of clarity to better understand the inventive concepts of the present disclosure. Additional features can be added in device substrate 102, and some of the features described below can be replaced, modified, or eliminated in other embodiments of device substrate 102.

The present disclosure provides for many different embodiments. An exemplary semiconductor structure includes a device substrate having a first side and a second side. A dielectric layer is disposed over the first side of the device substrate. A through via extends along a first direction through the dielectric layer and through the device substrate from the first side to the second side. The through via has a total length along the first direction and a width along a second direction that is different than the first direction. The total length is a sum of a first length of the through via in the dielectric layer and a second length of the through via in the device substrate. The first length is less than the second length. A guard ring is disposed in the dielectric layer and around the through via.

In some embodiments, a ratio of the first length to the second length is about 0.25 to about 0.5. In some embodiments, a ratio of the width to the first length is about 0.5 to about 2.0. In some embodiments, the first length is about 1.5 μm to about 2.5 μm and the width is about 1.5 μm to about 2.5 μm. In some embodiments, the through via is a metal via.

In some embodiments, the guard ring includes metal layers stacked along the first direction. The metal layers include first sidewalls and second sidewalls. The first sidewalls form an inner sidewall of the guard ring and the second sidewalls form an outer sidewall of the guard ring. The first sidewalls are aligned along an axis that extends along the first direction. In some embodiments, the inner sidewall bounds a region of the dielectric layer and the through via extends through the region of the dielectric layer. In some embodiments, a distance between the inner sidewall and the through via is about 0.2 μm to about 0.5 μm. The distance is along the second direction. In some embodiments, the semiconductor structure further includes a top contact layer connected to the through via and the guard ring. In some embodiments, the metal layers of the guard ring include a first set of metal layers and a second set of metal layers. The first set of metal layers is disposed between the device substrate and the second set of metal layers. The second set of metal layers is connected to the first set of metal layers and the top contact layer. In some embodiments, the top contact layer has a first thickness along the first direction, the second set of metal layers has a second thickness along the first direction, and the first set of metal layers has a third thickness along the first direction. In some embodiments, the first thickness is greater than the second thickness and the third thickness. In some embodiments, the third thickness is greater than the second thickness.

An exemplary semiconductor arrangement includes a first semiconductor structure and a second semiconductor structure. The first semiconductor structure has a dielectric layer over a semiconductor substrate. A conductive structure extends a first distance through the dielectric layer of the first semiconductor structure and a second distance through the semiconductor substrate of the first semiconductor structure to the second semiconductor structure. A ratio of the first distance to the second distance is about 0.25 to about 0.5. A stack of interconnect structures is disposed in the dielectric layer. The stack of interconnect structures forms a ring around the conductive structure. In some embodiments, a ratio of a diameter of the conductive structure and the first distance is about is about 0.5 to about 2. In some embodiments, the first distance is less than a thickness of the dielectric layer and the second distance is equal to a thickness of the semiconductor substrate. In some embodiments, the conductive structure includes a copper plug disposed over a barrier layer.

In some embodiments, the first semiconductor structure is a first chip and the second semiconductor structure is a second chip. In some embodiments, the first semiconductor structure further includes metallization layers disposed in the dielectric layer, and a number of interconnect structures in the stack of interconnect structures is equal to a number of metallization layers disposed in the dielectric layer. In some embodiments, the stack of interconnect structures have a substantially vertical sidewall, and the dielectric layer fills a spacing between the conductive structure and the substantially vertical sidewall. In some embodiments, the spacing between the conductive structure and the substantially vertical sidewall is about 0.2 µm to about 0.5 µm. In some embodiments, the stack of interconnect structures includes metal lines and vias. Each interconnect structure of the stack of interconnect structures has a respective metal line and a respective via. The metal lines have first sidewalls facing the conductive structure and second sidewalls that are opposite the first sidewalls. In some embodiments, the first sidewalls are vertically aligned.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   a device substrate having a first side and a second side;
   a dielectric layer disposed over the first side of the device substrate;
   a through via that extends along a first direction through the dielectric layer and through the device substrate from the first side to the second side, wherein:
      the through via has a total length along the first direction and a width along a second direction that is different than the first direction,
      the total length is a sum of a first length of the through via in the dielectric layer and a second length of the through via in the device substrate, and
      the first length is less than the second length; and
   a guard ring disposed in the dielectric layer and around the through via.

2. The semiconductor structure of claim 1, wherein a ratio of the first length to the second length is about 0.25 to about 0.5.

3. The semiconductor structure of claim 1, wherein a ratio of the width to the first length is about 0.5 to about 2.0.

4. The semiconductor structure of claim 3, wherein the first length is about 1.5 µm to about 2.5 µm and the width is about 1.5 µm to about 2.5 µm.

5. The semiconductor structure of claim 1, wherein:
   the guard ring includes metal layers stacked along the first direction;
   the metal layers include first sidewalls and second sidewalls;
   the first sidewalls form an inner sidewall of the guard ring and the second sidewalls form an outer sidewall of the guard ring; and
   the first sidewalls are aligned along an axis that extends along the first direction.

6. The semiconductor structure of claim 5, wherein:
   the inner sidewall bounds a region of the dielectric layer;
   the through via extends through the region of the dielectric layer; and
   a distance between the inner sidewall and the through via is about 0.2 µm to about 0.5 µm and the distance is along the second direction.

7. The semiconductor structure of claim 5, further comprising a top contact layer connected to the through via and the guard ring, wherein:
   the metal layers of the guard ring include a first set of metal layers and a second set of metal layers, wherein the first set of metal layers is disposed between the device substrate and the second set of metal layers and the second set of metal layers is connected to the first set of metal layers and the top contact layer;
   the top contact layer has a first thickness along the first direction, the second set of metal layers has a second thickness along the first direction, and the first set of metal layers has a third thickness along the first direction; and
   the first thickness is greater than the second thickness and the third thickness and the third thickness is greater than the second thickness.

8. The semiconductor structure of claim 1, wherein the through via is a metal via.

9. A semiconductor arrangement comprising:
   a first semiconductor structure having a dielectric layer over a semiconductor substrate;
   a second semiconductor structure;
   a conductive structure that extends a first distance through the dielectric layer of the first semiconductor structure and a second distance through the semiconductor substrate of the first semiconductor structure to the second semiconductor structure, wherein a ratio of the first distance to the second distance is about 0.25 to about 0.5; and
   a stack of interconnect structures disposed in the dielectric layer, wherein the stack of interconnect structures form a ring around the conductive structure.

10. The semiconductor arrangement of claim 9, wherein a ratio of a diameter of the conductive structure and the first distance is about is about 0.5 to about 2.

11. The semiconductor arrangement of claim 9, wherein the first distance is less than a thickness of the dielectric layer and the second distance is equal to a thickness of the semiconductor substrate.

12. The semiconductor arrangement of claim 9, wherein the first semiconductor structure is a first chip and the second semiconductor structure is a second chip.

13. The semiconductor arrangement of claim 9, wherein the first semiconductor structure further includes metallization layers disposed in the dielectric layer, wherein a number of interconnect structures in the stack of interconnect structures is equal to a number of metallization layers disposed in the dielectric layer.

14. The semiconductor arrangement of claim 9, wherein the conductive structure includes a copper plug disposed over a barrier layer.

15. The semiconductor arrangement of claim 9, wherein the stack of interconnect structures have a substantially vertical sidewall, wherein the dielectric layer fills a spacing between the conductive structure and the substantially vertical sidewall.

16. The semiconductor arrangement of claim 15, wherein the spacing between the conductive structure and the substantially vertical sidewall is about 0.2 μm to about 0.5 μm.

17. The semiconductor arrangement of claim 15, wherein:
the stack of interconnect structures includes metal lines and vias, wherein each interconnect structure of the stack of interconnect structures has a respective metal line and a respective via; and
the metal lines have first sidewalls facing the conductive structure and second sidewalls that are opposite the first sidewalls, wherein the first sidewalls are vertically aligned.

18. A method comprising:
forming a back-end-of-line (BEOL) structure over a first side of a semiconductor substrate, wherein the BEOL structure includes patterned metal layers disposed in a dielectric layer, the semiconductor substrate has a second side opposite the first side, the BEOL structure has a first thickness, the semiconductor substrate has a second thickness, and the second thickness is greater than the first thickness;
forming a trench that extends through the dielectric layer of the BEOL structure and to a depth D in the semiconductor substrate, wherein the depth D is greater than the first thickness and less than the second thickness;
forming a conductive structure in the trench; and
performing a thinning process on the second side of the semiconductor substrate to expose the conductive structure, wherein the conductive structure extends from the first side to the second side of the semiconductor substrate after the thinning process.

19. The method of claim 18, wherein the conductive structure has a first length in the dielectric layer and a second length in the semiconductor substrate and a ratio of the first length to the second length is about 0.25 to about 0.5.

20. The method of claim 18, further comprising forming a stack of interconnect structures while forming the BEOL structure, wherein the stack of interconnect structures forms a ring that defines a region of the dielectric layer and wherein the trench is formed in and extends through the region of the dielectric layer.

* * * * *